(12) United States Patent  
Chyan et al.

(10) Patent No.: US 8,769,467 B2
(45) Date of Patent: Jul. 1, 2014

(54) METHOD AND SYSTEM FOR UTILIZING HARD AND PREFERRED RULES FOR C-ROUTING OF ELECTRONIC DESIGNS

(75) Inventors: David Chyan, Saratoga, CA (US); Satish Raj, Saratoga, CA (US)

(73) Assignee: Cadence Design Systems, Inc., San Jose, CA (US)

(*) Notice: Subject to any disclaimer, the term of this patent is extended or adjusted under 35 U.S.C. 154(b) by 902 days.

(21) Appl. No.: 11/964,639

(22) Filed: Dec. 26, 2007

(65) Prior Publication Data

US 2009/0172628 A1 Jul. 2, 2009

(51) Int. Cl.
*G06F 17/50* (2006.01)

(52) U.S. Cl.
USPC .......................................... 716/130

(58) Field of Classification Search
USPC ........................................ 716/1–18
See application file for complete search history.

(56) References Cited

U.S. PATENT DOCUMENTS

| | | | |
|---|---|---|---|
| 6,363,518 B1* | 3/2002 | Lee | 716/122 |
| 6,446,246 B1 | 9/2002 | Suto | |
| 6,543,043 B1* | 4/2003 | Wang et al. | 716/122 |
| 6,957,407 B2 | 10/2005 | Suto | |
| 7,062,737 B2 | 6/2006 | Tetelbaum et al. | |
| 7,072,815 B1* | 7/2006 | Chaudhary et al. | 703/13 |
| 7,194,720 B1* | 3/2007 | Borer et al. | 716/121 |
| 7,257,797 B1* | 8/2007 | Waller et al. | 716/122 |
| 2002/0046389 A1* | 4/2002 | Hirakimoto et al. | 716/8 |
| 2004/0015803 A1* | 1/2004 | Huang et al. | 716/10 |
| 2004/0221253 A1 | 11/2004 | Imper et al. | |
| 2007/0245280 A1 | 10/2007 | Van Eijk et al. | |
| 2008/0250376 A1* | 10/2008 | Burch et al. | 716/13 |
| 2009/0055782 A1* | 2/2009 | Fu et al. | 716/4 |

OTHER PUBLICATIONS

Final Office Action dated Nov. 19, 2009 for U.S. Appl. No. 11/838,195.
Leong, H.K.-S Advanced routing in changing technology landscape. Proc. 2003 International Symposium on Physical Design, 2003, 118-121.
Linsker, R. An iterative-improvement penalty-function-driven wire routing system. IBM Journal of Research and Development, 28(5), 1984, 613-624.
Nair, R. A simple yet effective technique for global wiring. IEEE Transactions on CAD, 6(2) 1987, 165-172.
Kao et al., Cross point Assignment with Rerouting for General-Architecture Design, 1995, IEEE, pp. 337-348.
The Non-Final Office Action dated Apr. 16, 2009 for U.S. Appl. No. 11/838,195.
Define Polygon as Region, Virtuoso Chip Assembly Router User Reference for ICC, Product Version 11.2.41.03, 2005.
Define Region by Coordinates, Virtuoso Chip Assembly Router User Reference for ICC, Product Version 11.2.41.03, 2005.
Define Region, Virtuoso Chip Assembly Router User Reference for ICC, Product Version 11.2.41.03, 2005.
Define Region Forget, Virtuoso Chip Assembly Router User Reference for ICC, Product Version 11.2.41.03, 2005.

(Continued)

Primary Examiner — Vuthe Siek
Assistant Examiner — Aric Lin
(74) Attorney, Agent, or Firm — Vista IP Law Group, LLP

(57) ABSTRACT

An improved approach for implementing C-routing is described. Cost-based analysis is performed to balance the different rule requirements, to optimize the assignment of objects and nets during C-routing.

23 Claims, 21 Drawing Sheets

(56) References Cited

OTHER PUBLICATIONS

Draw Region Menu, Virtuoso Chip Assembly Router User Reference for ICC, Product Version 11.2.41.03,2005.

Draw Region Mode, Virtuoso Chip Assembly Router User Reference for ICC, Product Version 11.2.41.03,2005.

Regions Report, Virtuoso Chip Assembly Router User Reference for ICC, Product Version 11.2.41.03, 2005.

Report Specify Regions, Virtuoso Chip Assembly Router User Reference for ICC, Product Version 11.2.41.03, 2005.

Using Area Rules, Virtuoso Chip Assembly Router User Reference for ICC, Product Version 11.2.41.03,2005.

Notice of Allowance dated Sep. 19, 2011 for U.S. App. No. 11/838,195.

* cited by examiner

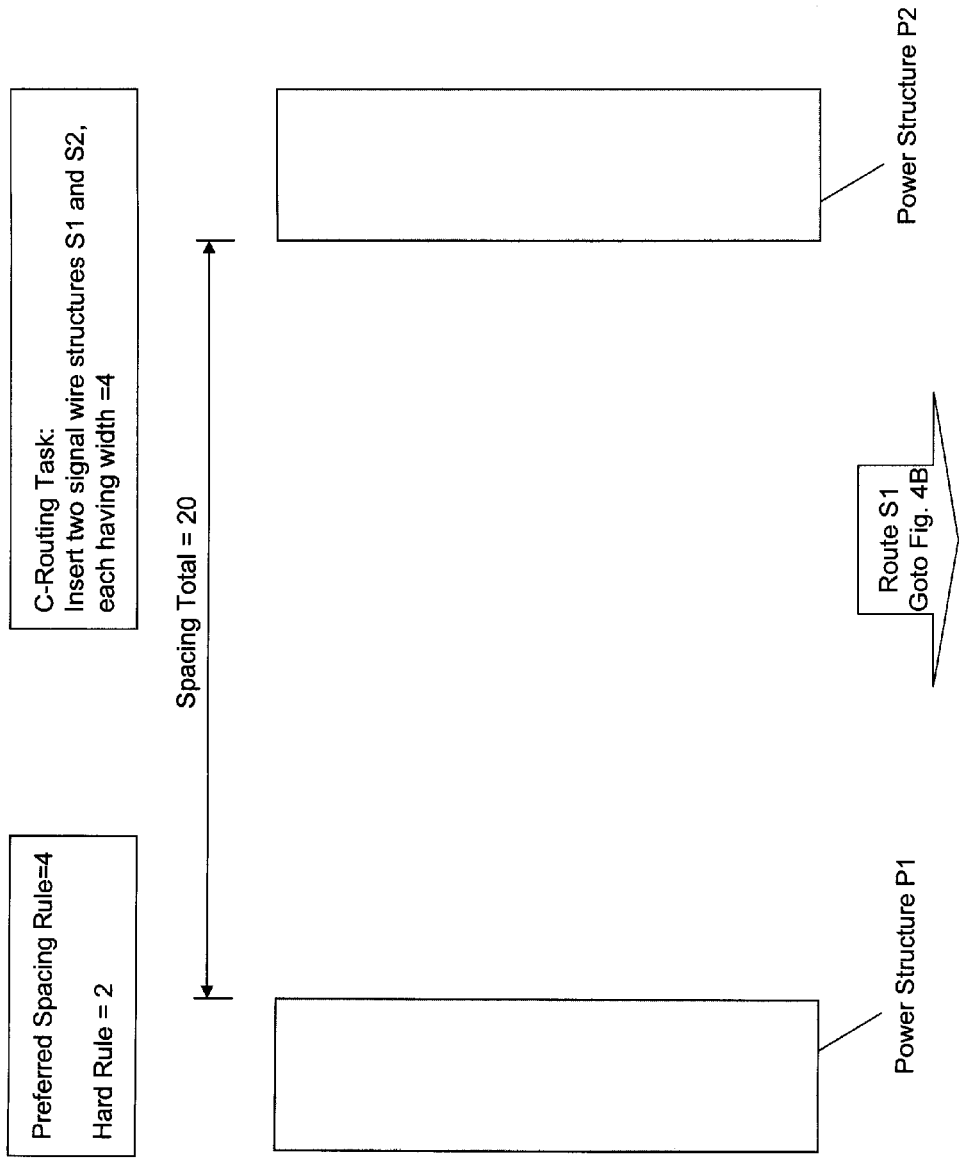

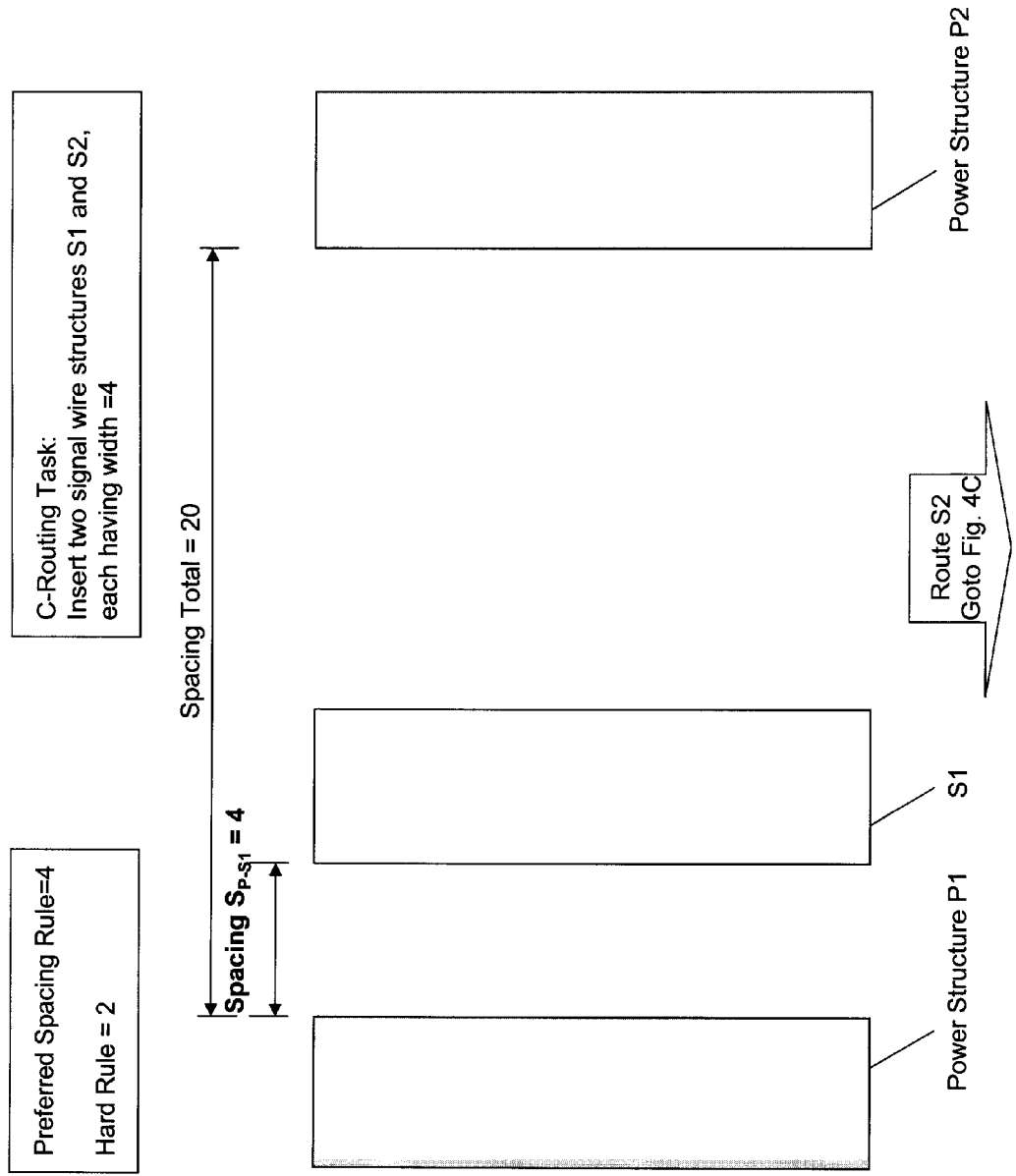

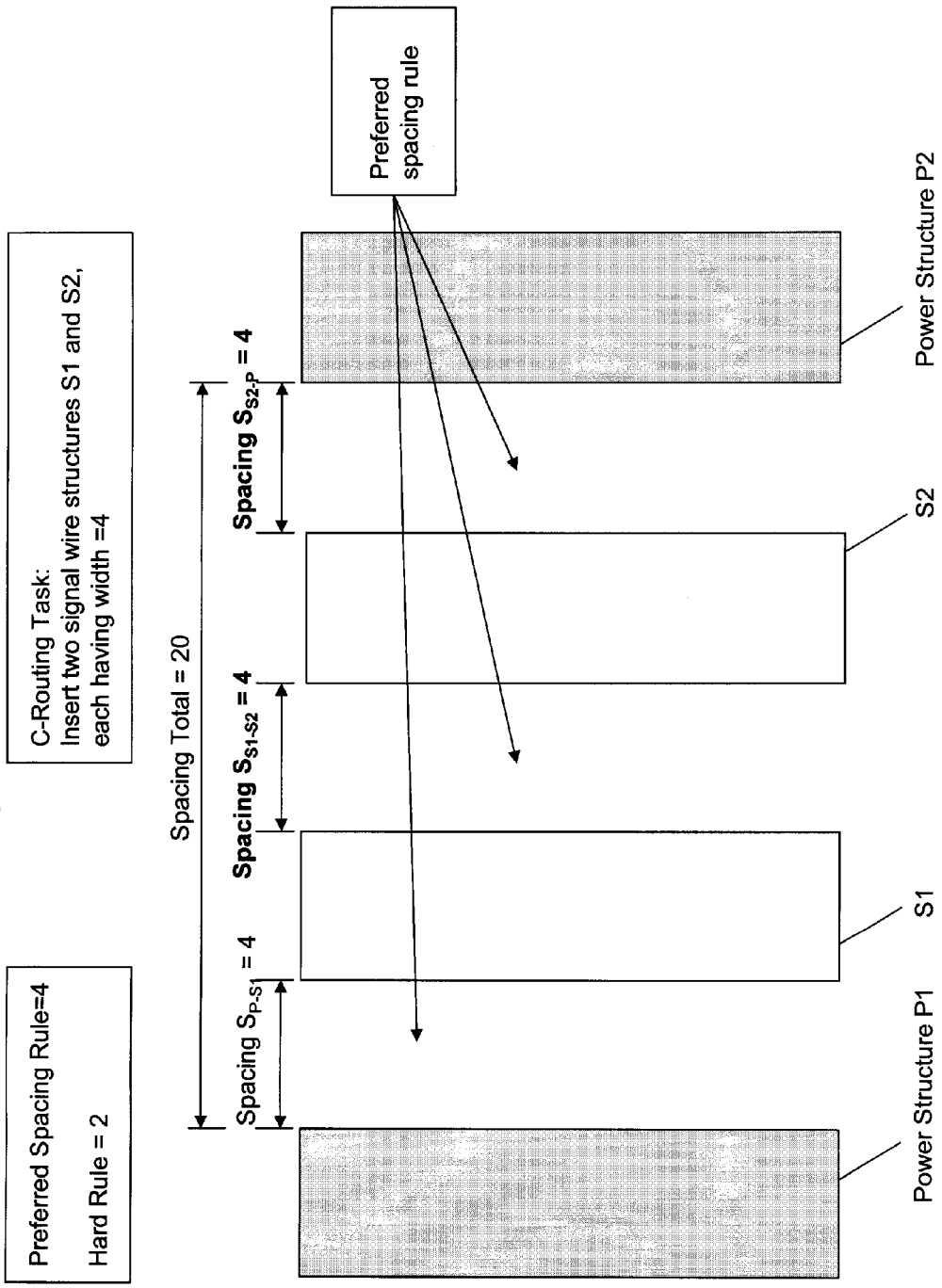

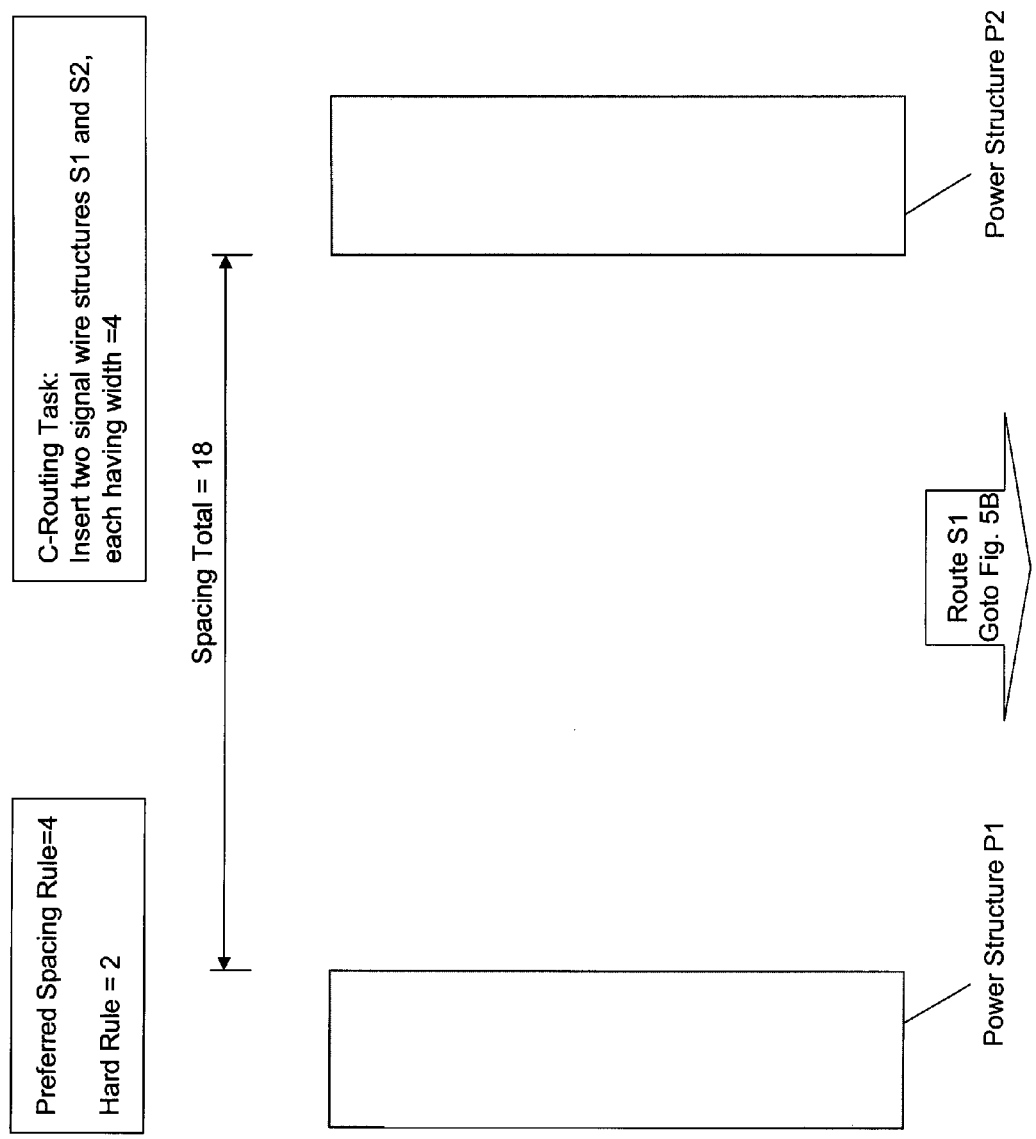

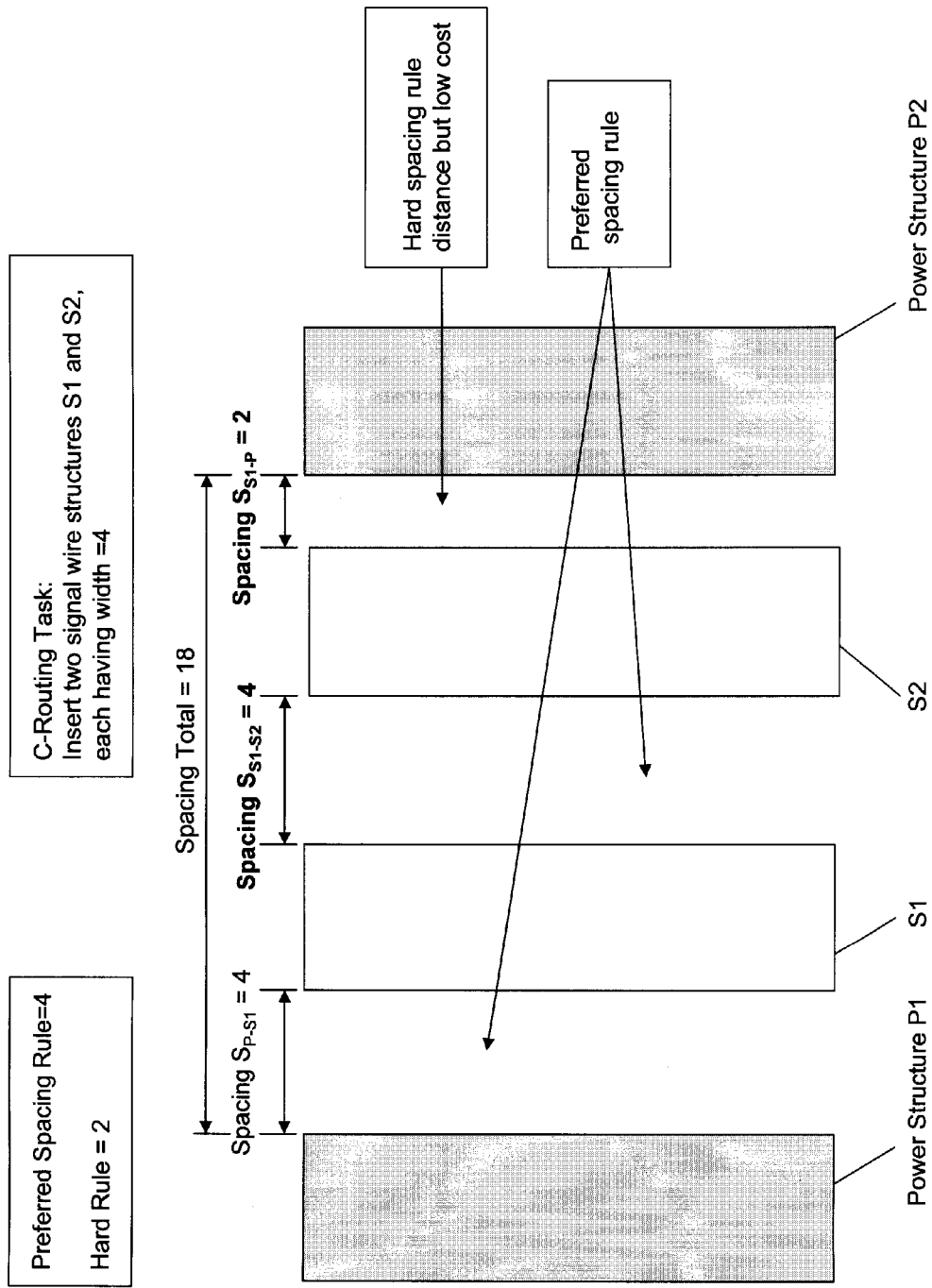

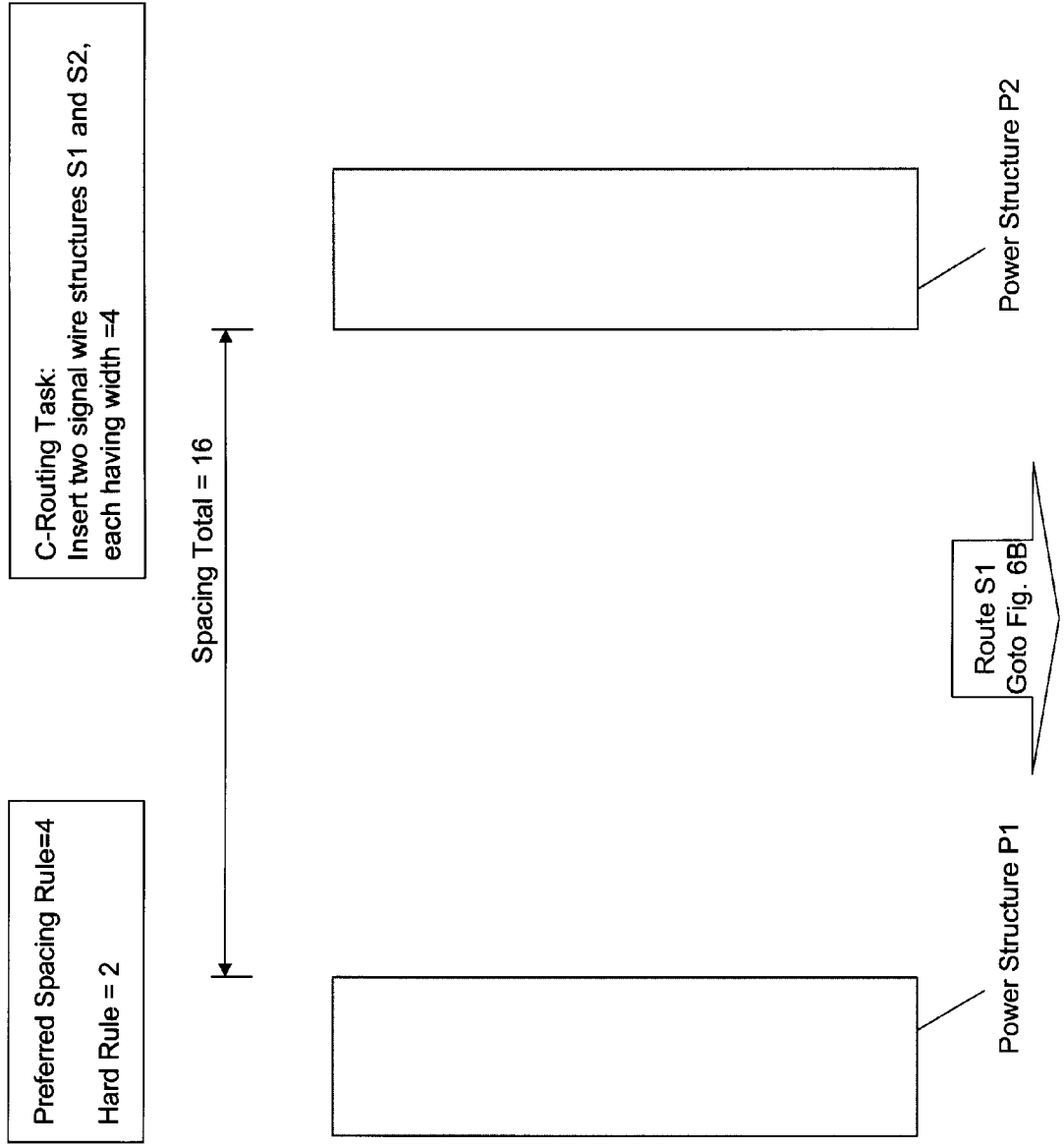

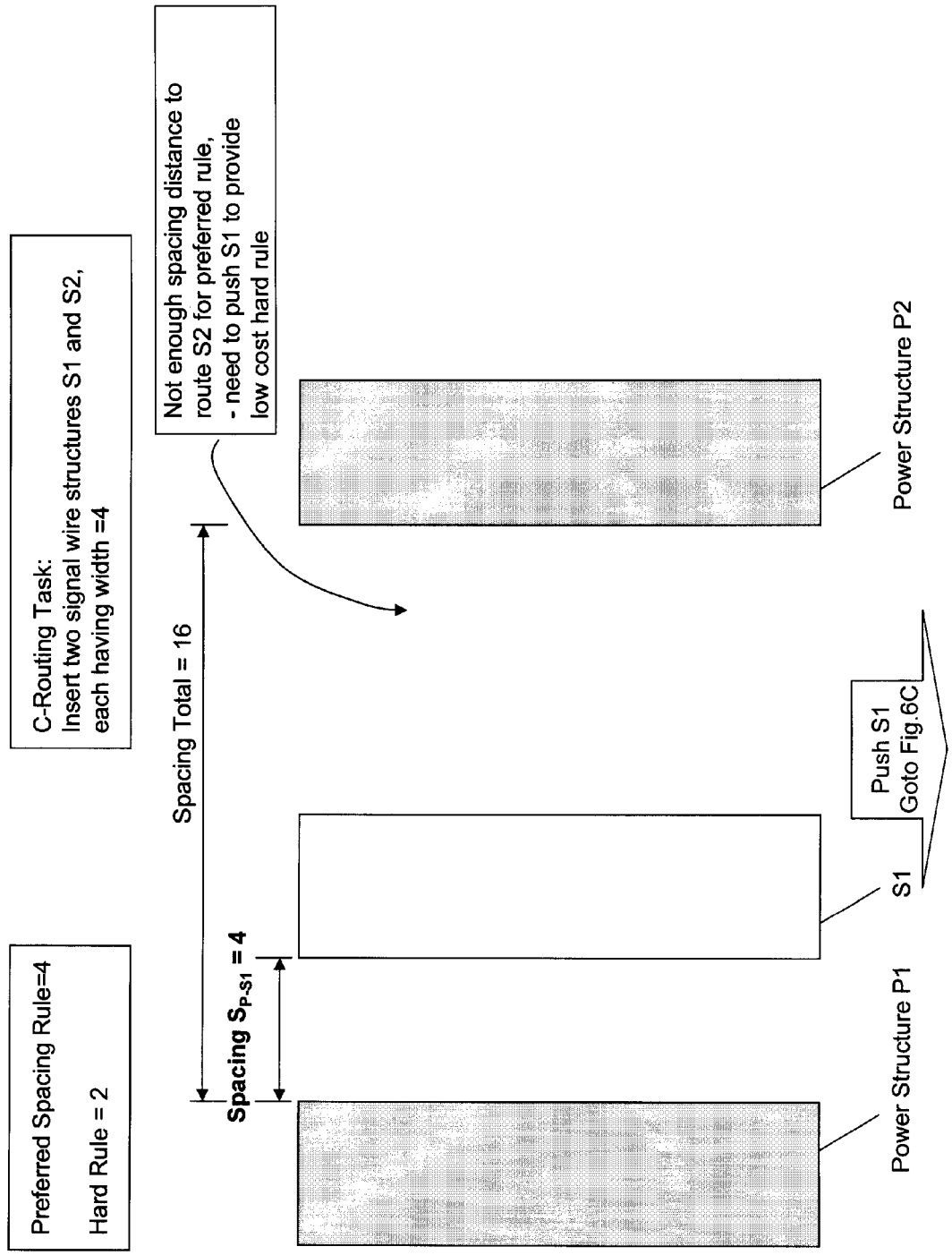

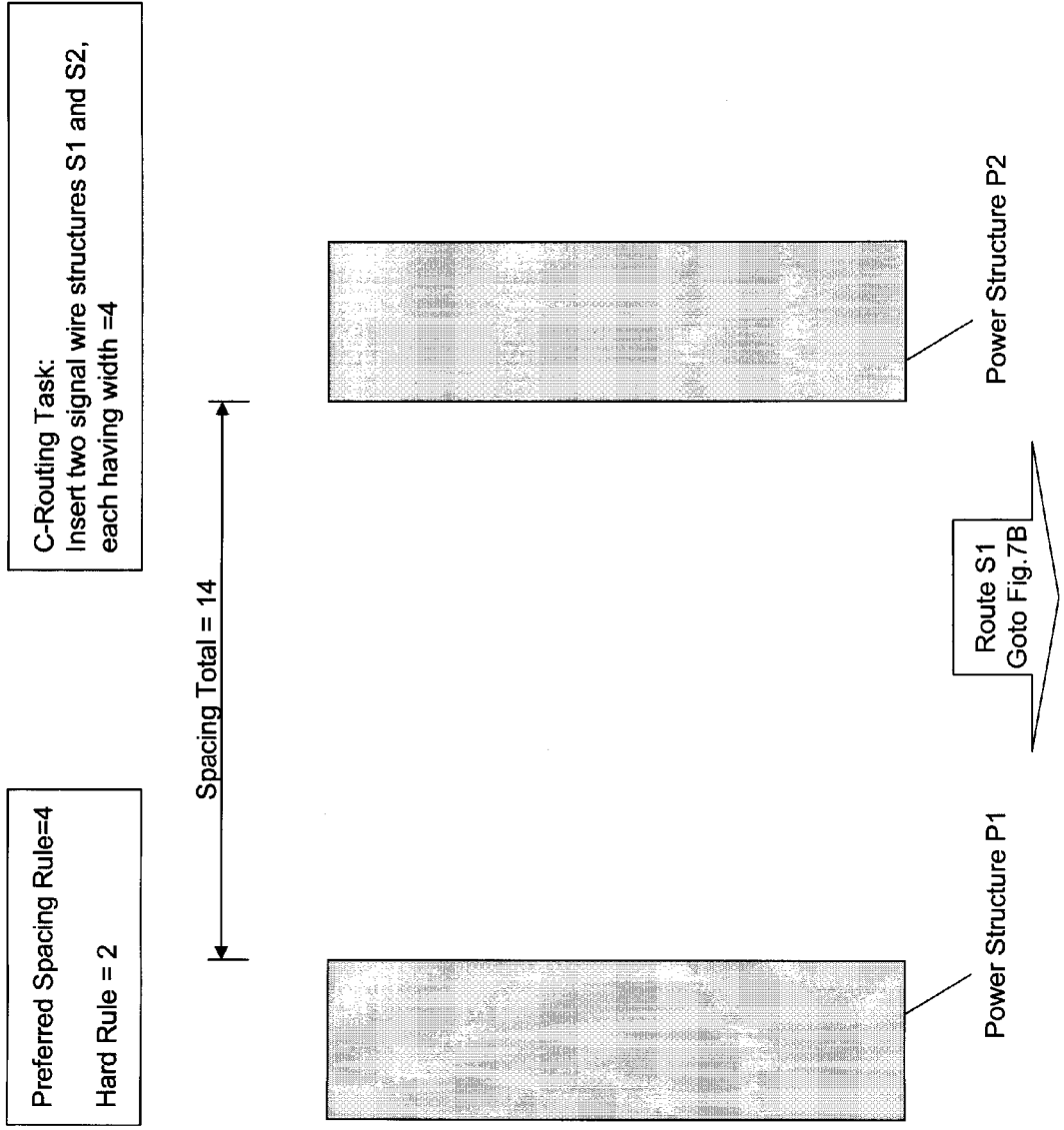

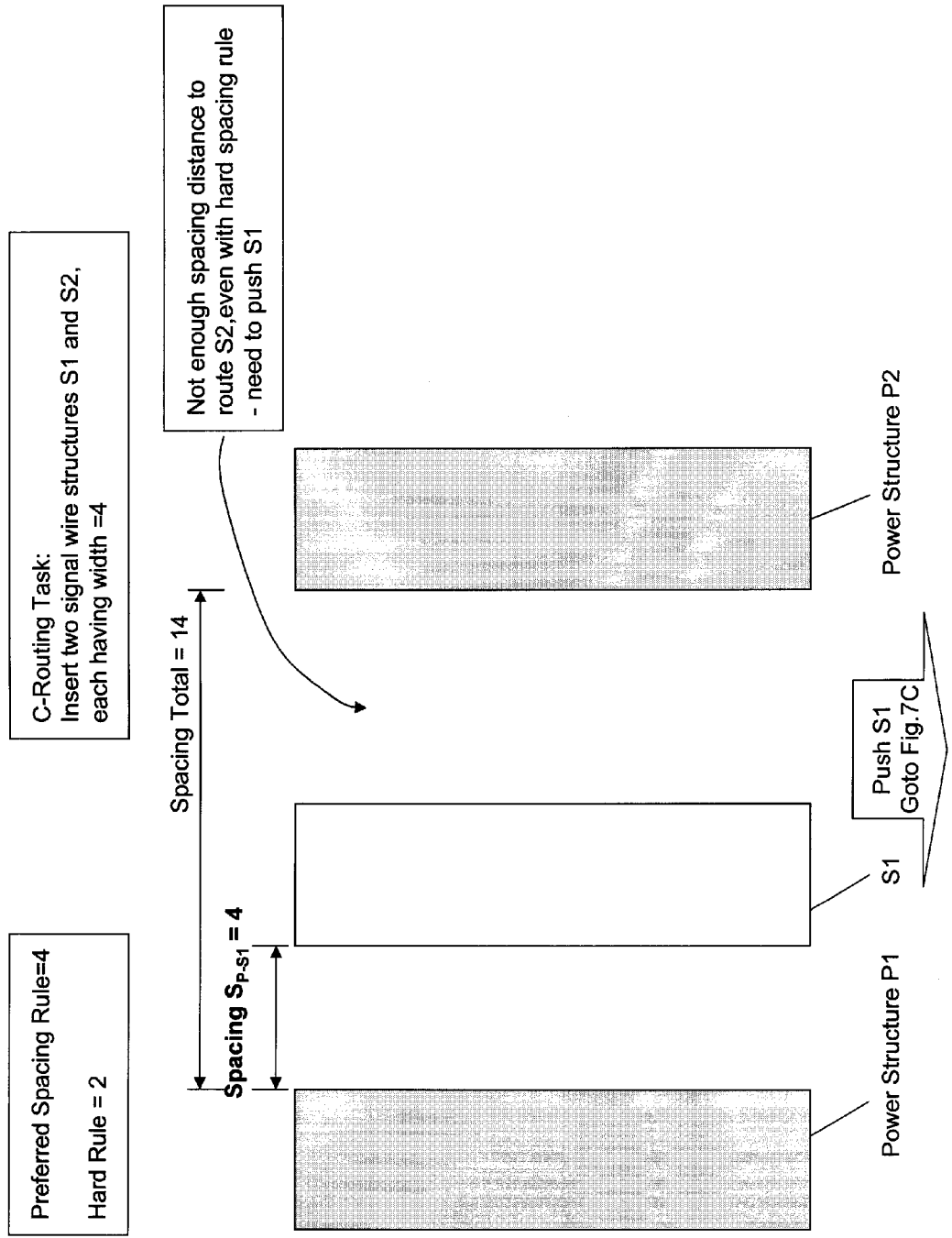

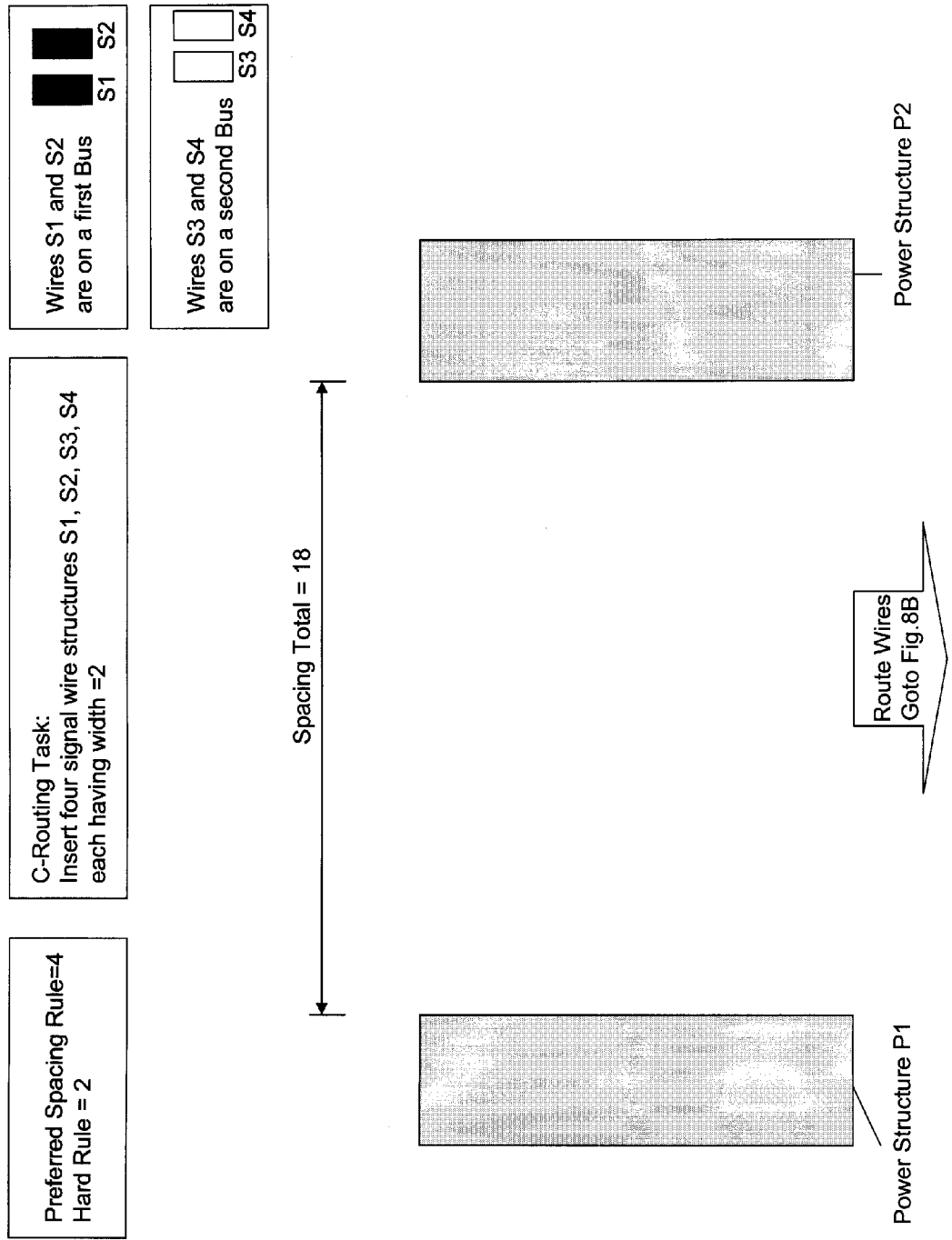

METHOD AND SYSTEM FOR UTILIZING HARD AND PREFERRED RULES FOR C-ROUTING OF ELECTRONIC DESIGNS

BACKGROUND AND SUMMARY

The invention relates to the design and manufacture of integrated circuits. An integrated circuit (IC) has a large number of electronic components, such as transistors, logic gates, diodes, and wires, which are fabricated by forming layers of different materials and of different geometric shapes on various regions of a silicon wafer. Many phases of physical design may be performed with computer aided design (CAD) tools or electronic design automation (EDA) systems. To design an integrated circuit, a designer first creates high level behavior descriptions of the IC device using a high-level hardware design language. An EDA system typically receives the high level behavior descriptions of the IC device and translates this high-level design language into netlists of various levels of abstraction using a computer synthesis process. A netlist describes interconnections of nodes and components on the chip and includes information of circuit primitives such as transistors and diodes, their sizes and interconnections, for example.

An integrated circuit designer may use a set of layout EDA application programs to create a physical integrated circuit design layout from a logical circuit design. The layout EDA application uses geometric shapes of different materials to create the various electrical components on an integrated circuit and to represent electronic and circuit IC components as geometric objects with varying shapes and sizes. After an integrated circuit designer has created an initial integrated circuit layout, the integrated circuit designer then verifies and optimizes the integrated circuit layout using a set of EDA testing and analysis tools. Verification may include, for example, design rule checking to verify compliance with rules established for various IC parameters.

Typically, geometric information about the placement of the nodes and components onto the chip is determined by a placement process and a routing process. The placement process is a process for placing electronic components or circuit blocks on the chip and the routing process is the process for creating interconnections between the blocks and components according to the specified netlist.

The task of all routers is the same—routers are given some pre-existing polygons consisting of pins on cells and optionally some pre-routes from the placers to create geometries so that all pins assigned to different nets are connected by wires and vias, that all wires and vias assigned to different nets do not overlap, and that all design rules are obeyed. That is, a router fails when two pins on the same net that should be connected are open, when two pins on two different nets that should remain open are shorted, or when some design rules are violated during routing.

One of the early routing algorithms is the Lee algorithm, which is also commonly called the maze routing algorithm. The Lee algorithm is known to find a route if one exists. Nonetheless, the Lee algorithm is also known to be slow and memory intensive. As such, the application of the base Lee algorithm to electronic designs over a certain size is oftentimes impractical. Moreover, the Lee algorithm approach often breaks down if there is a large number of nets or sets of nets that need to be routed over a design.

One widely adopted solution for the impracticality of the Lee algorithm is the introduction of a two-level global routing, which decides the rough route for each net, followed by detailed routing. As global routing is performed to determine an approximate route for each wire, it is much faster than pure maze routing under the Lee algorithm. In addition to determining the rough route for each net, the objectives of global routing are typically to minimize the routing congestion and the total wirelength. After the global routing is complete, each area defined by each global cell or gcell (which may be referred to herein as a "grid") is then detailed routed by a detailed router.

Three-level routing may also be employed to route an electronic design. In this approach, "C-routing" (which refers to either corridor-routing or conduit-routing) is performed between the global and detailed routing actions. C-routing is performed to coordinate assignments for routes which cross one or more global cell boundaries defined during the global routing stage. Thus, C-routing will determine the major part or trunk of a route which cross multiple global cells, leaving mostly short connection within a global cell to be handled by the detail router. The three-level routing technique provides a very effective "divide and conquer" approach for routing that allows each of the three levels of routers to effectively handle a manageable portion of the hierarchy of routing tasks.

The usual medium of communication between the IC design engineers and the foundry is through a set of design rules. The design rules provide design parameters and guidelines in an attempt to make sure that designers create IC designs which are manufacturable and will function for intended purposes. For example, the IC fabrication facility may provide spacing rules that specific the minimum spacing between any two objects in an IC design layout.

The design rules may be categorized into two types. The first type is called hard rules which are the design rules that must be obeyed in the IC design for fabrication/manufacturability. The second type is called soft rules or preferred rules which improve one or more factors such as timing, manufacturability, or yield but are not required to be always met. While a designer may almost always desire the soft rule to be used to implement a design, there may be design constraints or layout restrictions that require the designer to instead create a design that comply with the hard rules.

Therefore, one common problem faced by a router is the situation when both the hard rules and the preferred rules need to be considered during the design process. In many cases, it is very difficult for a router to effectively and efficiently understand how to balance the need to comply with hard rules while also attempting to implement a design using soft rules. At the global router level, one approach that can be taken to address hard and soft rules is described in U.S. patent application Ser. No. 11/838,195, filed on Aug. 13, 2007, which is hereby incorporated by reference in its entirety.

However, this problem cannot be efficiently and effectively managed at the detail router level. Quite simply, the quantity and complexity of analysis and management that needs to be performed to adequately consider both hard and soft rules at the detail router level is unmanageable with conventional design techniques.

Embodiments of the present invention provide an approach for perform C-routing which can simultaneously consider and balance both hard and soft rules when implementing C-routes for a design. By performing these actions during the C-routing process, this avoids (either in part or in its entirety) the complexity of having to simultaneously consider these types of rules during detail routing. Both hard rules and soft rules can be concurrently considered during C-routing to perform routing/track assignments across global cells as well as to route longer segments in the design.

Further details of aspects, objects, and advantages of the invention are described below in the detailed description, drawings, and claims. Both the foregoing general description and the following detailed description are exemplary and explanatory, and are not intended to be limiting as to the scope of the invention.

BRIEF DESCRIPTION OF THE FIGURES

The accompanying drawings are included to provide a further understanding of various embodiments of the invention and, together with the Detailed Description, serve to explain the principles of various embodiments of the invention.

FIGS. 4A-C provide an illustrative example for C-routing according to an embodiment of the invention, in which preferred soft spacing is employed to perform track assignments.

FIGS. 5A-C provide an illustrative example for C-routing where a hard rule spacing distance is employed to perform track assignments, but in which the hard rule spacing is at a relatively low cost.

FIGS. 6A-D provide an illustrative example for C-routing where a hard rule spacing distance is used to perform track assignments, but in which object pushing is employed such that the hard rule spacing is at a relatively low cost.

FIGS. 7A-D provide an illustrative example for C-routing where a hard rule spacing distance is used to perform track assignments at a relatively high cost.

FIGS. 8A-C provide an illustrative example for C-routing where net re-ordering is employed to perform track assignments to reduce costs.

DETAILED DESCRIPTION

In one embodiment, the present invention provides an approach for effectively considering both hard and soft rules simultaneously during the process of performing C-routing. As noted above, the design rules for an integrated circuit may be categorized into two types. The first type is called hard rules which are the design rules that must be obeyed in the IC design for fabrication or manufacturing purposes. The hard rules are often provided or imposed in an inflexible way by IC fabrication facilities. The second type is called soft rules or preferred rules which improve one or more factors such as timing, crosstalk, manufacturability, or yield. The soft rules do not necessarily need to be met in the IC design. The problem is that while it is often preferable to use the soft rules in a design, circumstances may require the hard design rules to be used instead. Embodiments of the present invention implement approaches that appropriately balance the use of hard and soft rules in an electronic design.

Figure 1:
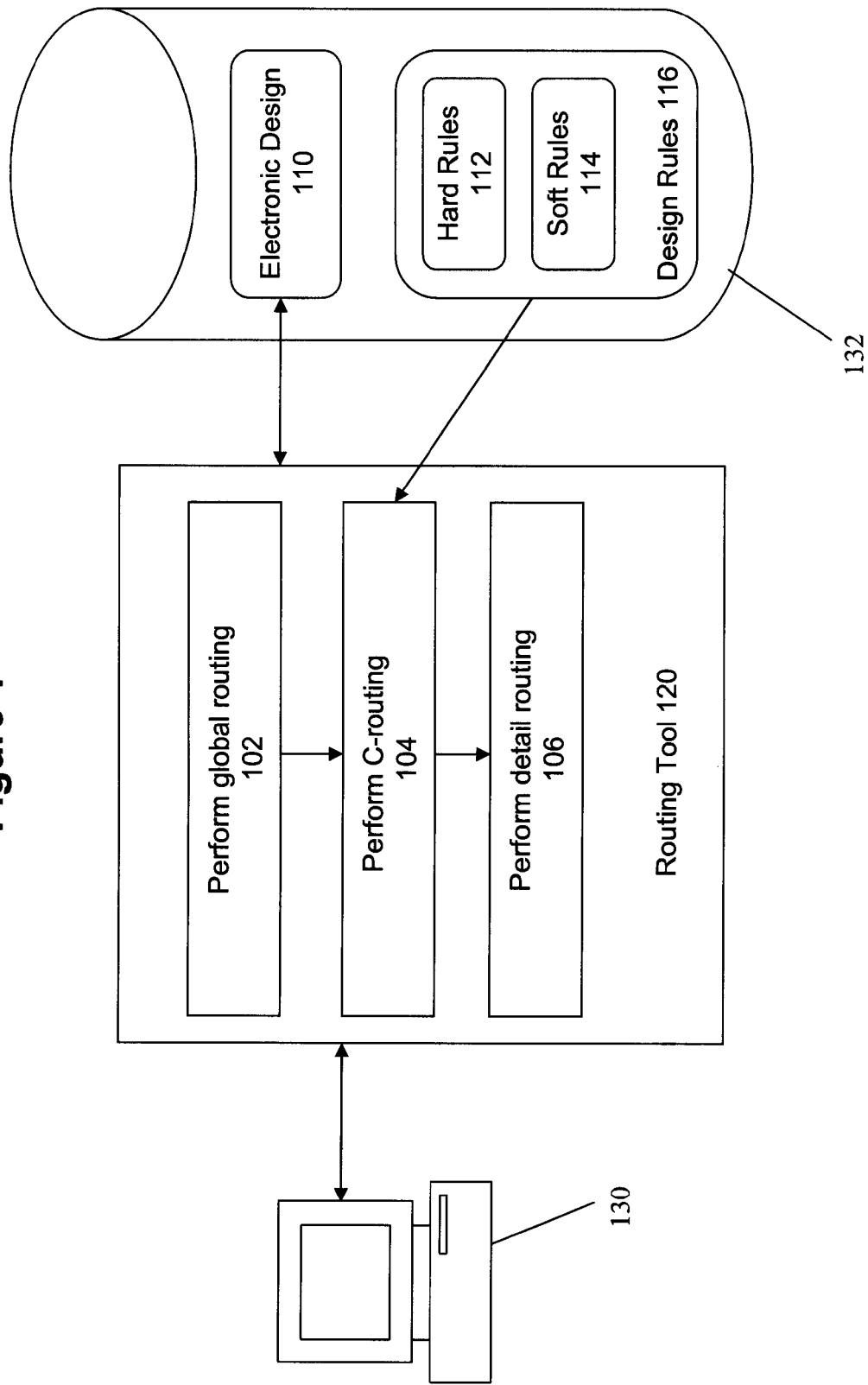
FIG. 1 illustrates an embodiment of a system for implementing some embodiments of the invention.

FIG. 1 shows a system architecture that may used to implement embodiments of the invention. User at one or more user stations 130 employ a routing tool 120 to perform routing functions for an electronic design 110. The routing tool 120 may be located on a computing device having one or more processors, where the one or more processors are used to execute program code corresponding to the routing tool 120. The computing device may also include memory or other readable medium to store data used by the routing tool 120 and to store results generated from the routing tool 120.

The routing functions for the electronic design 110 include the functions of global routing 102, C-routing 104, and detail routing 106. As previously noted, global routing 102 is used to provide a high-level approximation of routes for nets within the electronic design 110. C-routing 104 provides assignments for tracks between and across the boundaries of global cells within the design 110, and can also be used to implement relatively long segments within the design. Detailed routing 106 performs the detailed placement of shapes within the boundaries of Gcells in the layout, where the shapes correspond to the routing structures.

The electronic design 110 may be stored in a database 132. Database 132 may also be used to store the design rules 116, including the hard rules 112 and the soft rules 114. The C-routing 106 performed by routing tool 120 will access both the hard rules 112 and the soft rules 114 when performing the C-routing functions.

Figure 2:
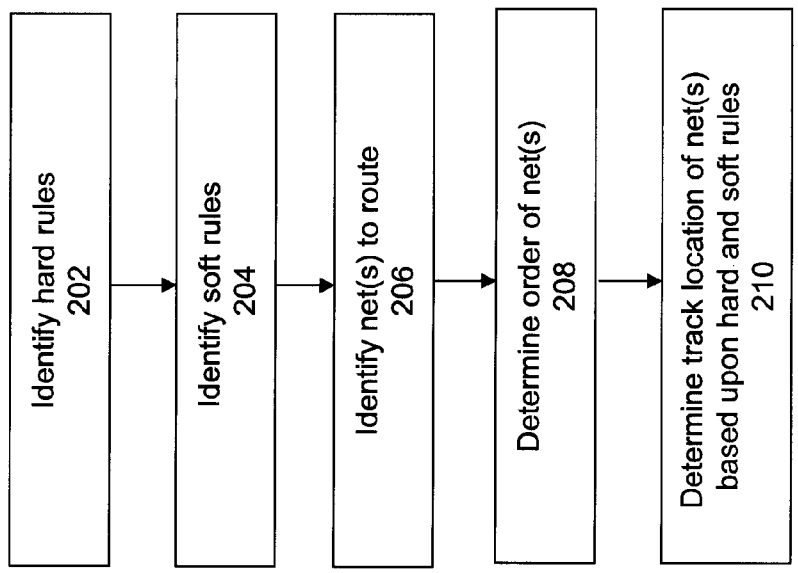
FIG. 2 shows a high level flow of a process for considering both hard rules and soft rules when performing C-routing, according to some embodiments of the invention.

FIG. 2 shows a high level flow of a process for considering both hard rules and soft rules when performing C-routing, according to some embodiments of the invention. At 202, the process identifies the set of hard rules that need to be considered when performing C-routing. These rules are often located as part of a rule deck provided by an IC foundry or fabrication/manufacturing facility. At 204, the process identifies a set of soft rules that are to be used for the design. The soft rules are the rules that have been identified as preferable to be used, but which do not necessarily need to be implemented if there are other constraints which prevent them from being applied. The soft rules may be provided by either the foundry or the user.

At 206, identification is made of the nets within the design that need to be routed. Based upon prior global routing, it is likely that the set of nets that need to be routed between global cells within the layout has already been determined. Therefore, this action is identifying the set of nets within a particular area or portion of the layout for which C-routing is needed. In some embodiment, this refers to the set of nets that need to be assigned to tracks within a global cell boundary or set of grid locations.

The order of the nets for C-routing may be determined at this point (208). According to some embodiments, an initial order of the nets to C-route may already have been determined during the global routing stage. However, to improve the balance between hard rules and soft rules, the net may be re-ordered at this C-routing stage, e.g., as described below with respect to FIGS. 8A-C. According to an alternate embodiment, the global routing stage has not yet provided an ordering of the nets. Therefore, this action 208 will provide an initial ordering for the nets to C-route.

At 210, the track locations will be determined for the nets that are being C-routed. The track assignments are made with consideration of both hard rules and soft rules, to create the optimal balance between the two sets of rules. According to some embodiments, a cost-based approach is taken to perform the track assignments. The routing option that complies with the design rules and which provide the lowest cost will be selected to implement the configuration of the track assignment.

Figure 3:
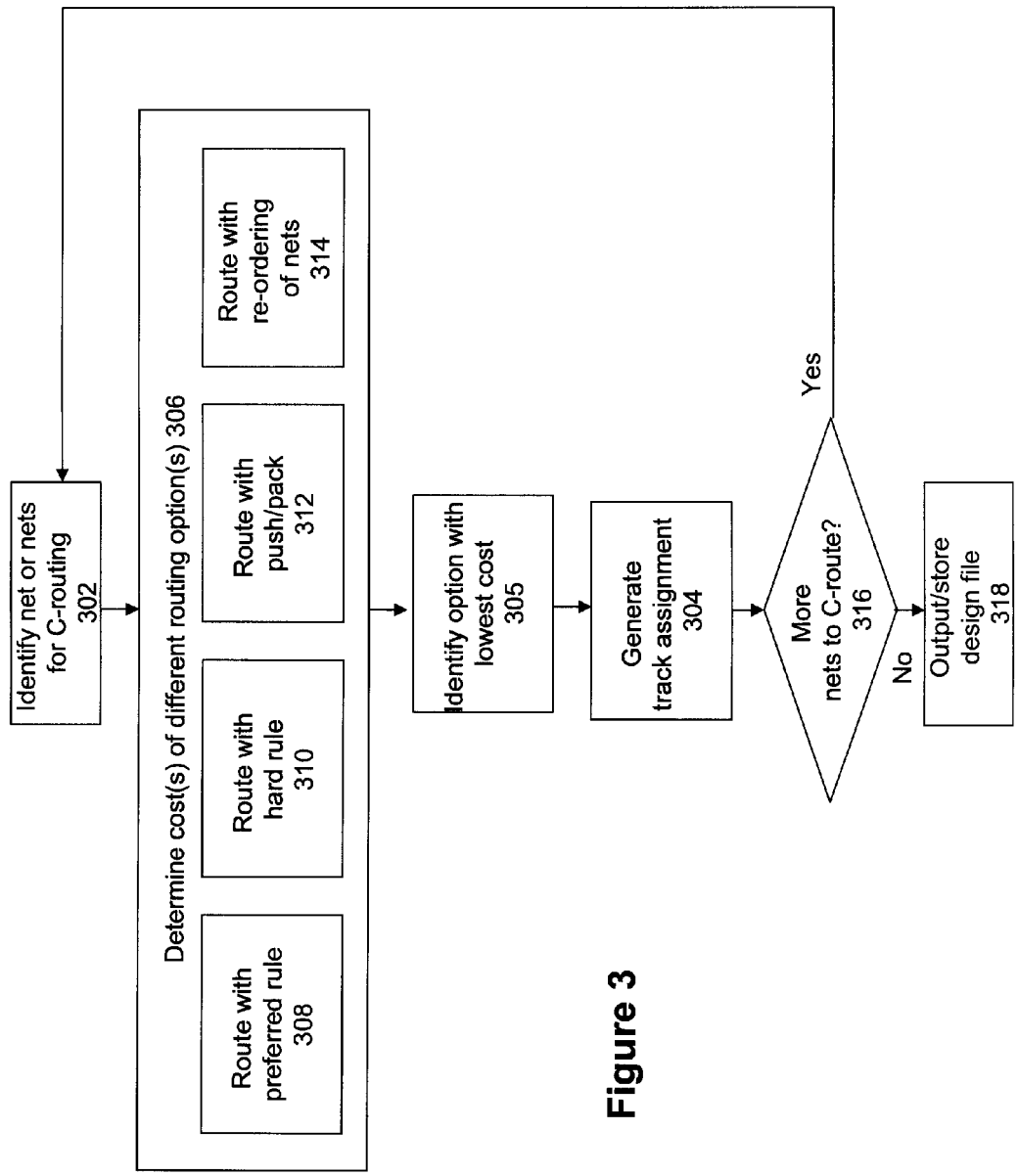
FIG. 3 shows a more detailed flowchart of a process for assigning nets to tracks during C-routing according to an embodiment of the invention.

FIG. 3 shows a more detailed flowchart of a process for assigning nets to tracks during C-routing according to an embodiment of the invention. At 302, the process identifies a particular net or set of nets that need to undergo C-routing. If the order of nets has already been identified, then this action merely takes the next net in the ordered list of nets that is awaiting C-routing.

Next, the process will identify the different routing options and the costs for each routing option (306). Each possible routing option is examined, particularly with respect to its surroundings, to determine a cost factor for that routing option.

A number of different parameters may be considered during the cost analysis process. For example, the cost of possible routing configurations for both hard rule compliance (310) and soft rule compliance (308) will be considered. In general, the cost of options that comply with soft rules will correspond to lower cost values than options that comply with hard rules (unless the hard rules are equivalent to the soft rules). For example, consider if a hard rule exists that requires a first wiring object in the layout to be spaced at least 2 nm away from another layout object, and a soft rule exists that would preferably space a wiring object at least 4 nm away from another object. Generally, the cost of the hard rule option (i.e., spacing of 2 nm) would be considered to have a higher cost value than the cost of the soft rule option (i.e., spacing of 4 nm). This is because the greater spacing distance of the soft rule option would tend to cause less electrical interference with and between wiring objects. Therefore, given the opportunity to choose between these two routing options, the lower cost spacing option of 4 nm would be chosen over the higher cost spacing option of 2 nm. Of course, the tension for designers is that there may be insufficient available spacing in the layout to allow the low cost soft rule option, and therefore, the higher cost option may necessarily have to be implemented.

Even with multiple options that comply with the same rule, one of the options may have a lower cost than the other option, based upon, for example, environmental factors and other nearby objects. For example, consider two routing configurations that both comply with a hard spacing rule of 2 nm. The first routing configuration may include a signal wire that is spaced 2 nm away from another signal wire. The second routing configuration may include a signal wire that is spaced 2 nm away from a power structure (e.g., a line that is connected to either ground or $V_{cc}$). Between these two configurations that both comply with the same spacing rule, the first configuration is likely to have a higher cost than the second option. This is because there is a higher likelihood of interference between two adjacent signal wires than there is between a signal wire and a power structure.

In some circumstances, configurations at the hard rule may actually be designated as having a lower cost than configurations at the soft rule. For example, consider again if a hard rule exists that requires a first wiring object in the layout to be spaced at least 2 nm away from another layout object, and a soft rule exists that would preferably space a wiring object at least 4 nm away from another object. Assume that there are two possible routing configurations, with the first option in compliance with the soft rule and the second option in compliance with the hard rule. The first routing configuration may include a signal wire that is spaced 4 nm away from another signal wire. The second routing configuration may include a signal wire that is spaced 2 nm away from a power structure (e.g., a line that is connected to either ground or $V_{cc}$). Many designers feel that power-related wiring structures provide sufficient beneficial shielding effects such that it would be preferable to locate a signal wire very close to a power structure. Therefore, it is possible under certain circumstances where the second option in compliance with the hard rule spacing distance, but in which the signal wire is adjacent to a power structure, would be assigned a lower cost value than the first option having two signal wires with a larger spacing distance between them.

Routing options may be considered that involve pushing or packing of layout objects (312). This option would result in the movement of existing layout objects to create sufficient space to insert wiring objects in the layout. Other possible options may consider the re-ordering of nets within the layout to identify net orders that provide for lower costs options (314). According to some embodiments, each of the factors 308, 310, 312, and 314 are individually considered to identify the lowest cost option. According to an alternative embodiment, a combination of the factors may be examined together to identify the lowest cost routing options.

A cost-based "neighbor" index may be used to weight the different routing parameters and options. The neighbor index may include different values that determine the preferability of different combinations of adjacency and adjacency spacings for layout objects. For example, a neighbor index of "0" may be assigned if there is a preference to locate two objects in adjacency with each other. To explain, consider a signal wire that is expected to be particularly sensitive to interference. This signal wire could be weighted with this index value to indicate a preference to locate the wire adjacent to a power object, to take advantage of the beneficial shielding associated with power structures. A neighbor index value of "1" could be used to indicate a neutral or "don't care" rating for a given configuration or adjacency. A neighbor index value of "2" could be assigned to situations in which there is a preference against a particular combination or adjacency. This index value could be assigned, for example, if there are signal wires that are very sensitive to adjacencies to certain other types of structures and for which it is desirable to weight against those adjacencies, e.g., particularly sensitive or critical signal wires from the same bus. In operation, the neighbor index could be used, for example, to determine the cost associated with different options when re-ordering nets to be routed.

Once the different routing options have been identified and cost values assigned to each option, identification is made of the lowest cost option among the possible routing configurations (305). The possible configurations could include variances in the spacing, ordering, and track/net locations for the different nets. At this point, the track assignment parameters are generated for the net being analyzed (304). A determination is made whether there are more nets to C-route. If so, then the process returns back to 302 to select another net. If not, then the C-route design information is displayed and/or stored.

The approach of FIG. 3 can be performed sequentially on a net-by-net basis, or it can be performed with the concurrent assignment and consideration of multiple nets. With the sequential approach, each net is routed according to its own local cost calculations, with subsequent nets routed after each preceding net has been completed. As a result, it is possible that the locally identified lower cost value for a routing configuration for a particular net may prove to be more expensive overall once additional nets are considered. Therefore, once it is later determined based upon analysis for a subsequent net that a different configuration for an earlier routed net would provide a lower overall cost, it is likely that the earlier configuration would need to be changed. Examples for this are provided below in conjunction with the object push examples of FIGS. 6A-D. In the alternative approach, the set of nets to be routed are concurrently considered upfront to identify overall costs for the different configurations, and the configuration for the set of nets providing the lowest cost can be implemented for the multiple nets on a simultaneous basis. Either approach may be employed in conjunction with the invention. For purposes of illustration, the below examples are described using the sequential approach.

FIGS. 4A-C provide an illustrative example for C-routing according to an embodiment of the invention, in which preferred soft spacing is employed to perform track assignments. FIG. 4A shows a layout portion that includes two power structures P1 and P2, which are, for example, power or ground wires. A total spacing distance of 20 exists between the edges of P1 and P2. The C-routing task is to configure the track assignments for two signal wires S1 and S2 between P1 and P2, where both S1 and S2 have widths of 4. Assume that the preferred soft spacing rule is a distance of 4 and minimum hard spacing rule is a spacing distance of 2. Also assume that the cost of a spacing distance of 4 is less than the cost of a spacing distance of 2. Further assume that the cost of a routing configuration in which a signal wire is adjacent to a power structure is less than the cost of a configuration in which two signal wires are adjacent.

Referring FIG. 4B, the first task is to C-route signal wire S1. Since the available spacing distance between P1 and P2 is a total of 20, there is sufficient room to make a track assignment for S1 in which S1 is at least the preferred spacing distance (i.e., 4) away from any other objects. It is also possible to make a track assignment for S1 in which S1 is at least the hard spacing rule distance (i.e., 2) away from other objects. However, as stated before, the cost of the preferred rule distance is less than the cost of the hard rule distance. Therefore, wire S1 will be placed adjacent to P1 with a preferred spacing distance $S_{P1-S1}$ of 4.

Next, signal wire S2 will be routed. As shown in FIG. 4C, there is enough available distance between the edges of S1 and P2 to make a track assignment for S2 in which S2 is at least the preferred spacing distance (i.e., 4) away from any other objects. It is also possible to make a track assignment for S2 in which S2 is at least the hard spacing rule distance (i.e., 2) away from other objects. However, since the cost of the preferred rule distance is less than the cost of the hard rule distance, the preferred spacing rule distance will be chosen. Therefore, wire S2 will be placed adjacent to S1 and P2 with a spacing distance $S_{S1-S2}$ of 4 between the edge of S1 and S2 and a spacing distance $S_{S2-P2}$ of 4 between the edge of S2 and P2.

In this example, there was sufficient available space to C-route both S1 and S2 with the preferred spacing rule. This was confirmed and implemented based upon the cost-based analysis showing that the lowest cost option is the option to use the preferred spacing rule distances.

Figure 5B:
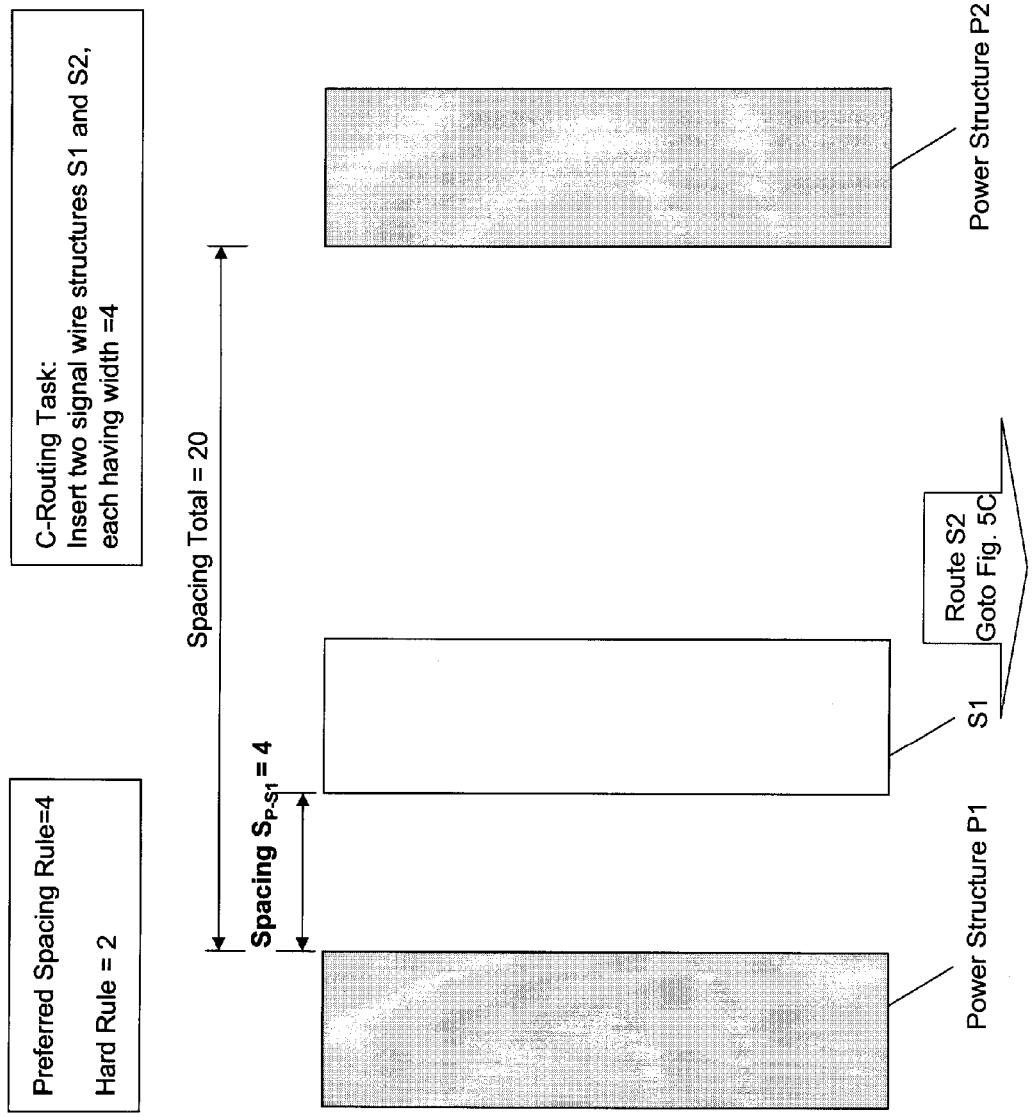

FIGS. 5A-C provide an illustrative example for C-routing where the hard rule spacing distance is employed to perform track assignments, but in which the hard rule spacing is at a relatively low cost. FIG. 5A shows a layout portion that includes two power structures P1 and P2, and in which a total spacing distance of 18 exists between the edges of P1 and P2. The C-routing task is to configure the track assignments for two signal wires S1 and S2 between P1 and P2, where both S1 and S2 have widths of 4. Assume that the preferred soft spacing rule is a distance of 4 and minimum hard spacing rule is a spacing distance of 2. Also assume that the cost of a spacing distance of 4 is less than the cost of a spacing distance of 2. Further assume that the cost of a routing configuration in which a signal wire is adjacent to a power structure is less than the cost of a configuration in which two signal wires are adjacent.

Referring FIG. 5B, the first task is to C-route signal wire S1. Since there is an available spacing distance total of 18 between P1 and P2, it is possible to make a track assignment for S1 in which S1 is at least the preferred spacing distance (i.e., 4) away from any other objects. It is also possible to make a track assignment for S1 in which S1 is at least the hard spacing rule distance (i.e., 2) away from other objects. However, as stated before, the cost of the preferred rule distance is less than the cost of the hard rule distance. Therefore, wire S1 will be placed adjacent to P1 with a spacing distance $S_{P1-S1}$ of 4.

Next, signal wire S2 will be routed. In this example, there is not enough remaining available distance between the edges of S1 and P2 to make a track assignment for S2 in which S2 is at the preferred spacing distance (i.e., 4) away from any other objects. However, as shown in FIG. 5C, it is possible to make the track assignment for S2 where the hard spacing rule distance (i.e., 2) is only applied between S2 and the power structure P2—the spacing distance between the two signal wires S1 and S2 could be configured at the preferred soft rule spacing distance of 4. The alternative is to make the spacing distance between S1 and S2 at 2, and the distance between S2 and P2 at 4. However, this alternative option is at a higher cost than the first option, since there is a higher cost to spacing two signal wires at the hard rule spacing distance than to have the hard rule spacing distance between a signal wire and a power structure. Therefore, wire S2 will be placed adjacent to S1 and P2 with a spacing distance $S_{S1-S2}$ of 4 between the edge of S1 and S2 and a spacing distance $S_{S2-P2}$ of 2 between the edge of S2 and P2.

Figure 6C:
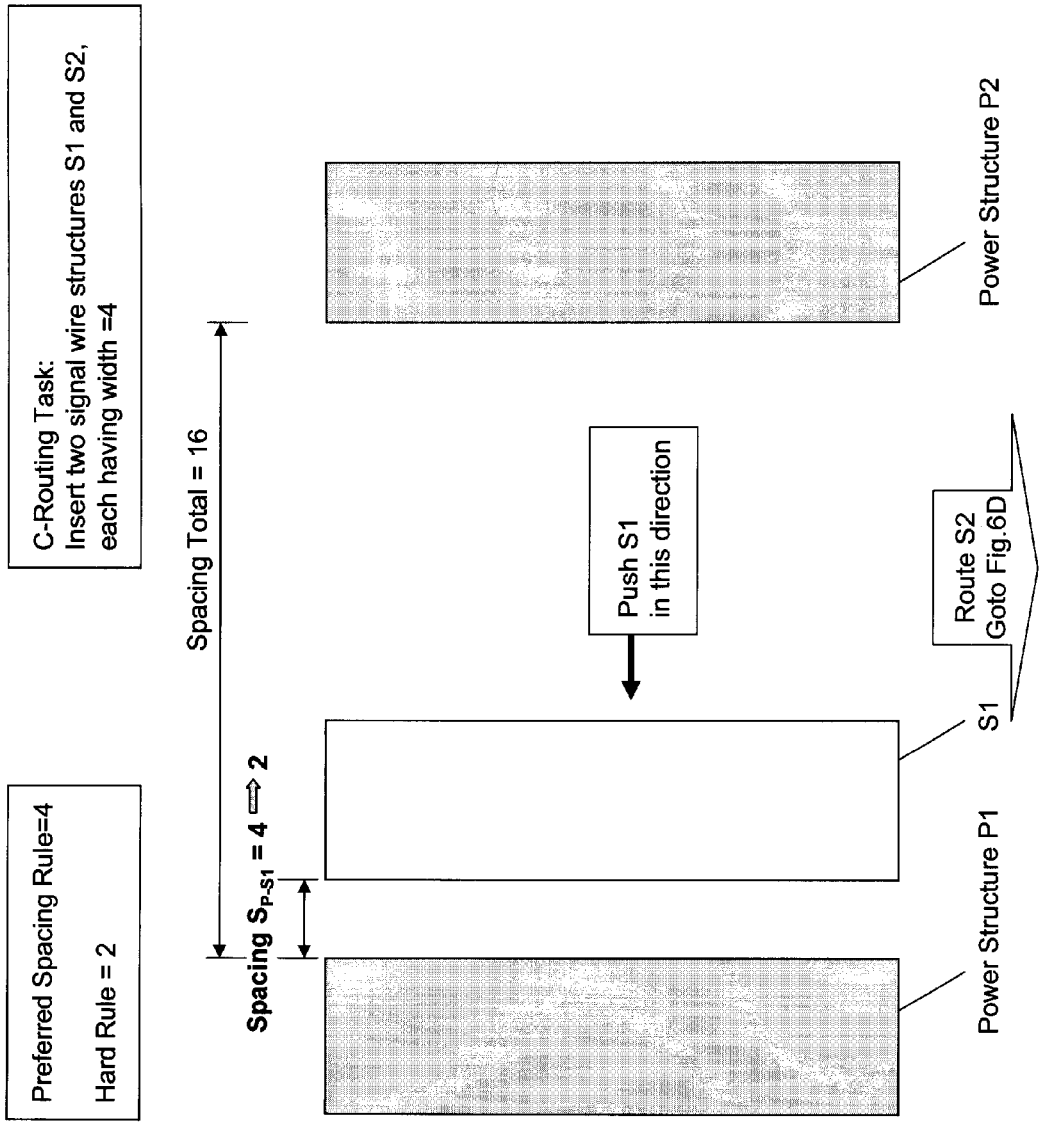

FIGS. 6A-D provide an illustrative example for C-routing where the hard rule spacing distance is used to perform track assignments, but in which object pushing is employed such that the hard rule spacing is at a relatively low cost. FIG. 6A shows a layout portion that includes two power structures P1 and P2, and in which a total spacing distance of 16 exists between the edges of P1 and P2. The C-routing task is to configure the track assignments for two signal wires S1 and S2 between P1 and P2, where both S1 and S2 have widths of 4. As before, assume that the preferred soft spacing rule is a distance of 4 and minimum hard spacing rule is a spacing distance of 2. Also assume that the cost of a spacing distance of 4 is less than the cost of a spacing distance of 2. Further assume that the cost of a routing configuration in which a signal wire is adjacent to a power structure is less than the cost of a configuration in which two signal wires are adjacent.

Referring FIG. 6B, the first task is to C-route signal wire S1. At this point, since S2 has not yet been routed, there is still available spacing between P1 and P2 such that it is possible to make a track assignment for S1 in which S1 is at least the preferred spacing distance (i.e., 4) away from any other objects. It is also possible to make a track assignment for S1 in which S1 is at least the hard spacing rule distance (i.e., 2) away from other objects. However, the cost of the preferred rule distance is less than the cost of the hard rule distance. Therefore, wire S1 will be placed adjacent to P1 with a spacing distance $S_{P1-S1}$ of 4.

Next, signal wire S2 will be routed. In this example, there is not enough remaining available distance between the edges of S1 and P2 to make a track assignment for S2 in which S2 is at the preferred spacing distance (i.e., 4) away from any other objects. In fact, there is even insufficient available space to make the track assignment for S2 where the hard spacing rule distance of 2 is only applied between S2 and the power structure P2, but where the spacing distance between the two signal wires S1 and S2 is configured at the preferred soft rule spacing distance of 4. The only available alternative at this point is to make the spacing distance between S1 and S2 at the hard rule spacing distance of 2 and the distance between S2 and P2 also at 2.

However, a configuration can be created in which a spacing distance of 4 exists between S1 and S2. As shown in FIG. 6C, this configuration can be created by pushing S1 a distance of 2 towards P1. This creates a distance of 10 between the edges of S1 and P2 available to route S2.

Figure 6D:
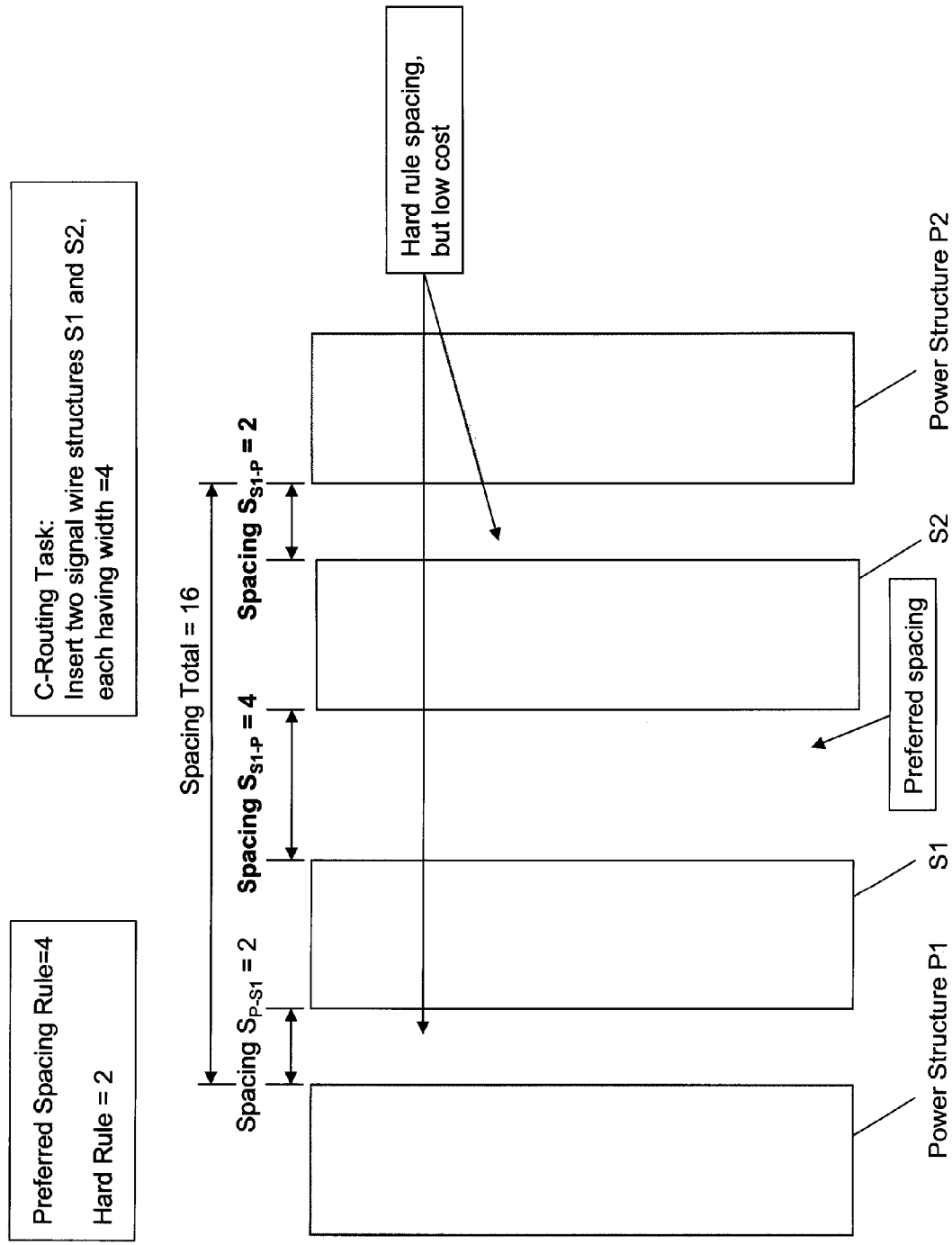

As shown in FIG. 6D, by shifting S1 in this manner, there is now sufficient space between S1 and P2 to make the track assignment for S2 where the hard spacing rule distance of 2 is only applied between S2 and the power structure P2, and the spacing distance between the two signal wires S1 and S2 configured at the preferred soft rule spacing distance of 4. Therefore, wire S2 will be placed adjacent to S1 and P2 with a spacing distance $S_{S1-S2}$ of 4 between the edge of S1 and S2 and a spacing distance $S_{S2-P2}$ of 2 between the edge of S2 and P2. Wire S1 will now be placed adjacent to P1 with a spacing distance $S_{P1-S1}$ of 2 between the edge of S1 and P1. Since the only spacing distances set at 2 are between signal wires and power structures, these are still considered to be at low cost configurations, even though configured at the hard rule spacing distances.

Figure 7C:
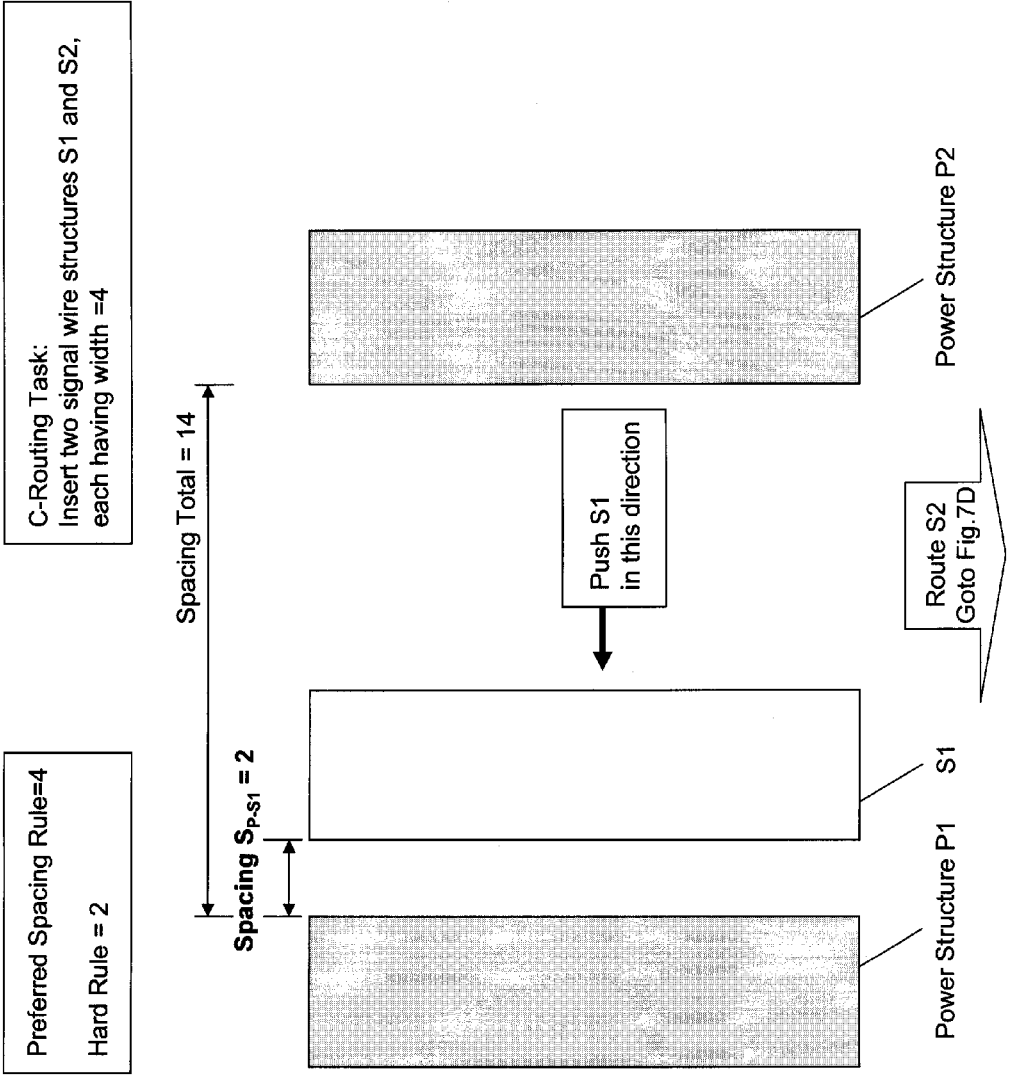

FIGS. 7A-D provide an illustrative example for C-routing where the hard rule spacing distance is used to perform track assignments at a relatively high cost. FIG. 7A shows a layout portion that includes two power structures P1 and P2, and in which a total spacing distance of 14 exists between the edges of P1 and P2. The C-routing task is to configure the track assignments for two signal wires S1 and S2 between P1 and P2, where both S1 and S2 have widths of 4. As before, assume that the preferred soft spacing rule is a distance of 4 and minimum hard spacing rule is a spacing distance of 2. Also assume that the cost of a spacing distance of 4 is less than the cost of a spacing distance of 2. Further assume that the cost of a routing configuration in which a signal wire is adjacent to a power structure is less than the cost of a configuration in which two signal wires are adjacent.

Referring FIG. 7B, the first task is to C-route signal wire S1. At this point, since S2 has not yet been routed, there is still available spacing between P1 and P2 such that it is possible to make a track assignment for S1 in which S1 is at least the preferred spacing distance (i.e., 4) away from any other objects. It is also possible to make a track assignment for S1 in which S1 is at least the hard spacing rule distance (i.e., 2) away from other objects. However, the cost of the preferred rule distance is less than the cost of the hard rule distance. Therefore, wire S1 will be placed adjacent to P1 with a spacing distance $S_{P1-S1}$ of 4.

Next, signal wire S2 will be routed. In this example, the distance between the edges of S1 and P2 provides only a distance of 6, which is not enough to route S2 even at the hard rule spacing distances. This is because the width of S2 (i.e., 4) added to the minimum required spacing between S2 and S1 (i.e., 2) and the minimum required spacing between S2 and P2 (i.e., 2) adds up to a required minimum spacing of 8.

Figure 7D:
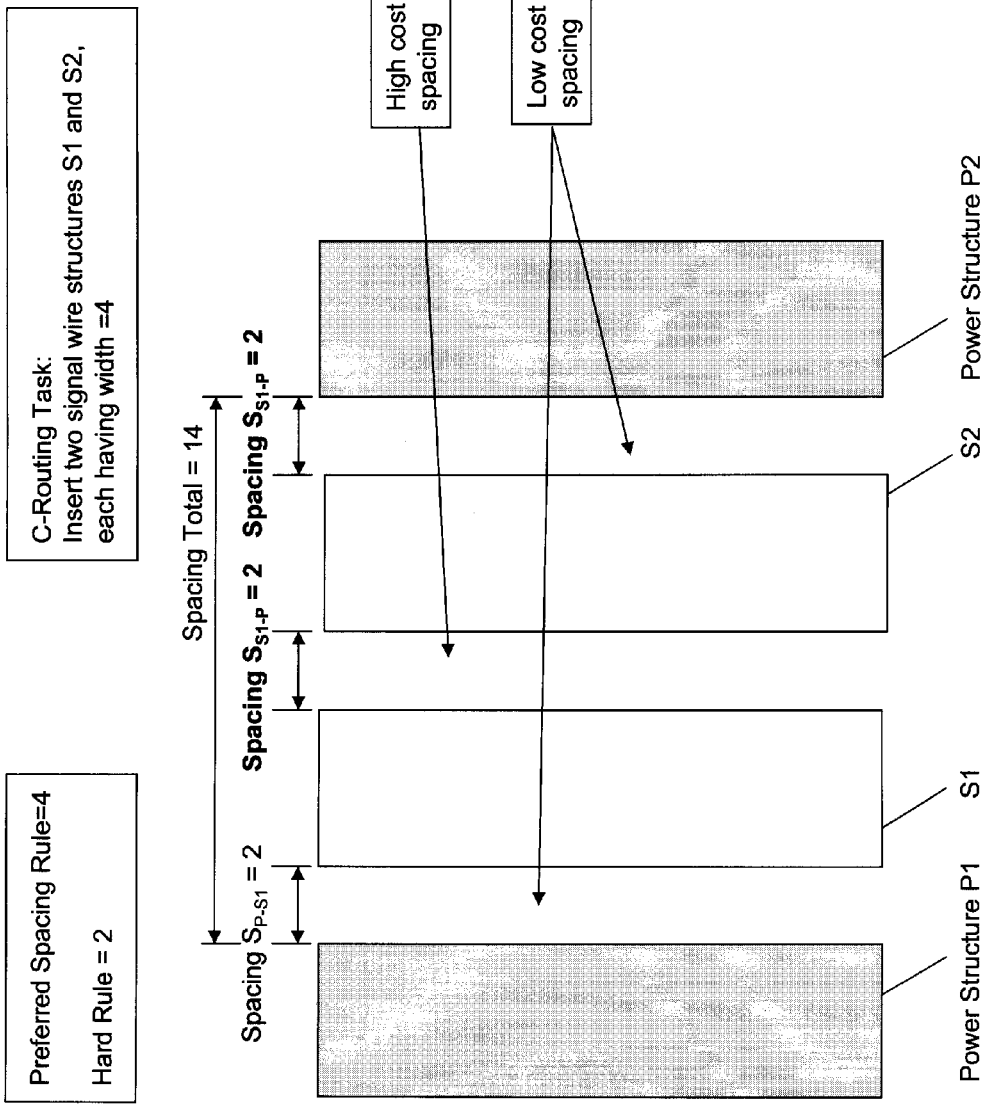

To create enough available space to place wire S2, S1 is pushed towards P1, as shown in FIG. 7C. This configuration is created by pushing S1 a distance of 2 towards P1. This creates a distance of 8 between the edges of S1 and P2 available to route S2. As shown in FIG. 7D, by shifting S1 in this manner, there is now sufficient space between S1 and P2 to make the track assignment for S2 where the hard spacing rule distance of 2 is applied between S2 and the power structure P2.

However, there is only sufficient space to permit the spacing distance between the two signal wires S1 and S2 to be configured at the hard rule spacing distance of 2. Therefore, wire S2 will be placed adjacent to S1 and P2 with a spacing distance $S_{S1-S2}$ of 2 between the edge of S1 and S2 and a spacing distance $S_{S2-P2}$ of 2 between the edge of S2 and P2. Wire S1 will now be placed adjacent to P1 with a spacing distance $S_{P1-S1}$ of 2 between the edge of S1 and P1. Since the spacing distances of 2 are set between signal wires and power structures, these are still considered to be at low cost configurations, even though configured at the hard rule spacing distances. However, the spacing distance of 2 between signal wires S1 and S2 at the hard rule spacing distance is considered to be an unavoidable high cost configuration requirement for this situation.

Figure 8B:
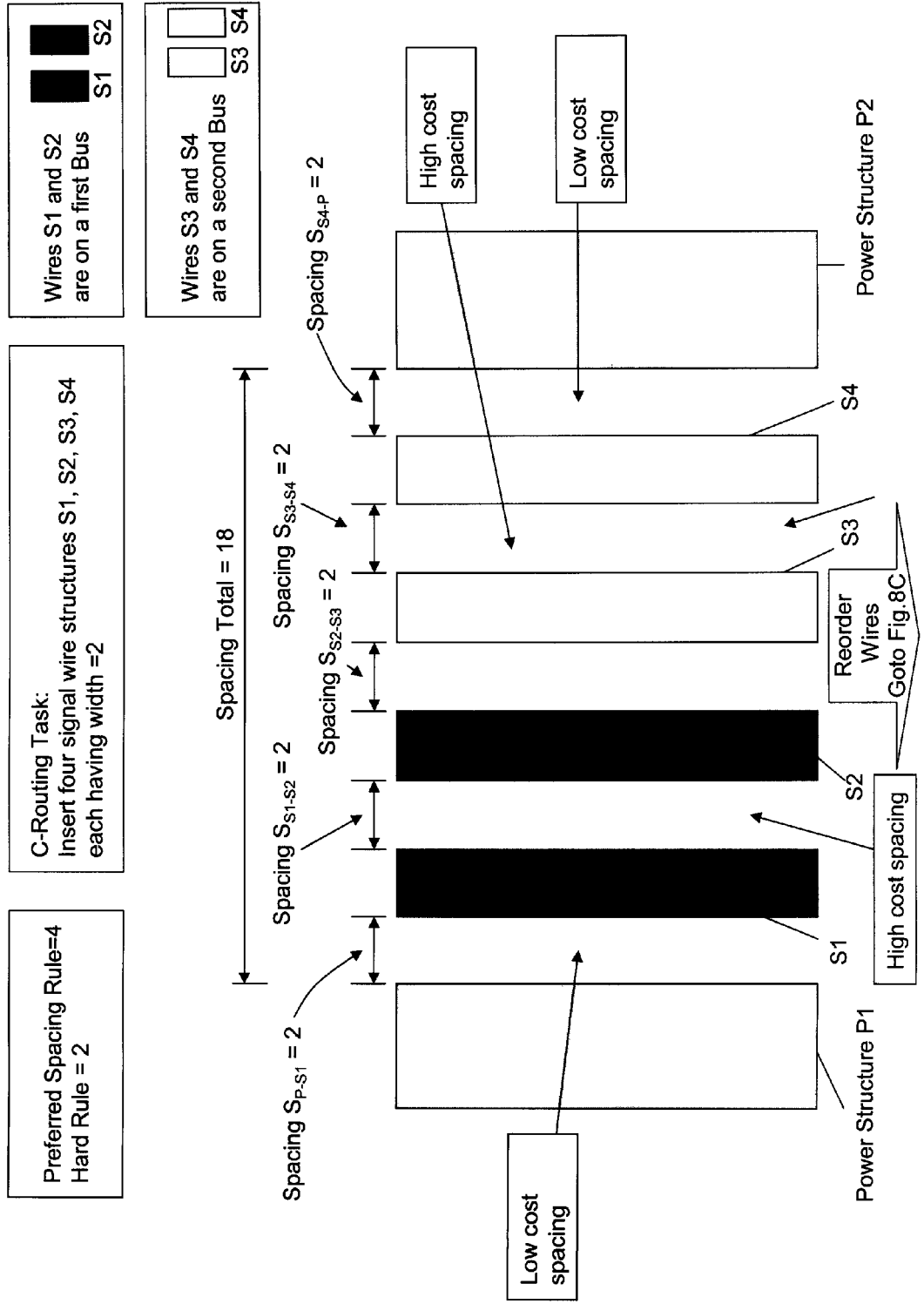
Figure 8C:
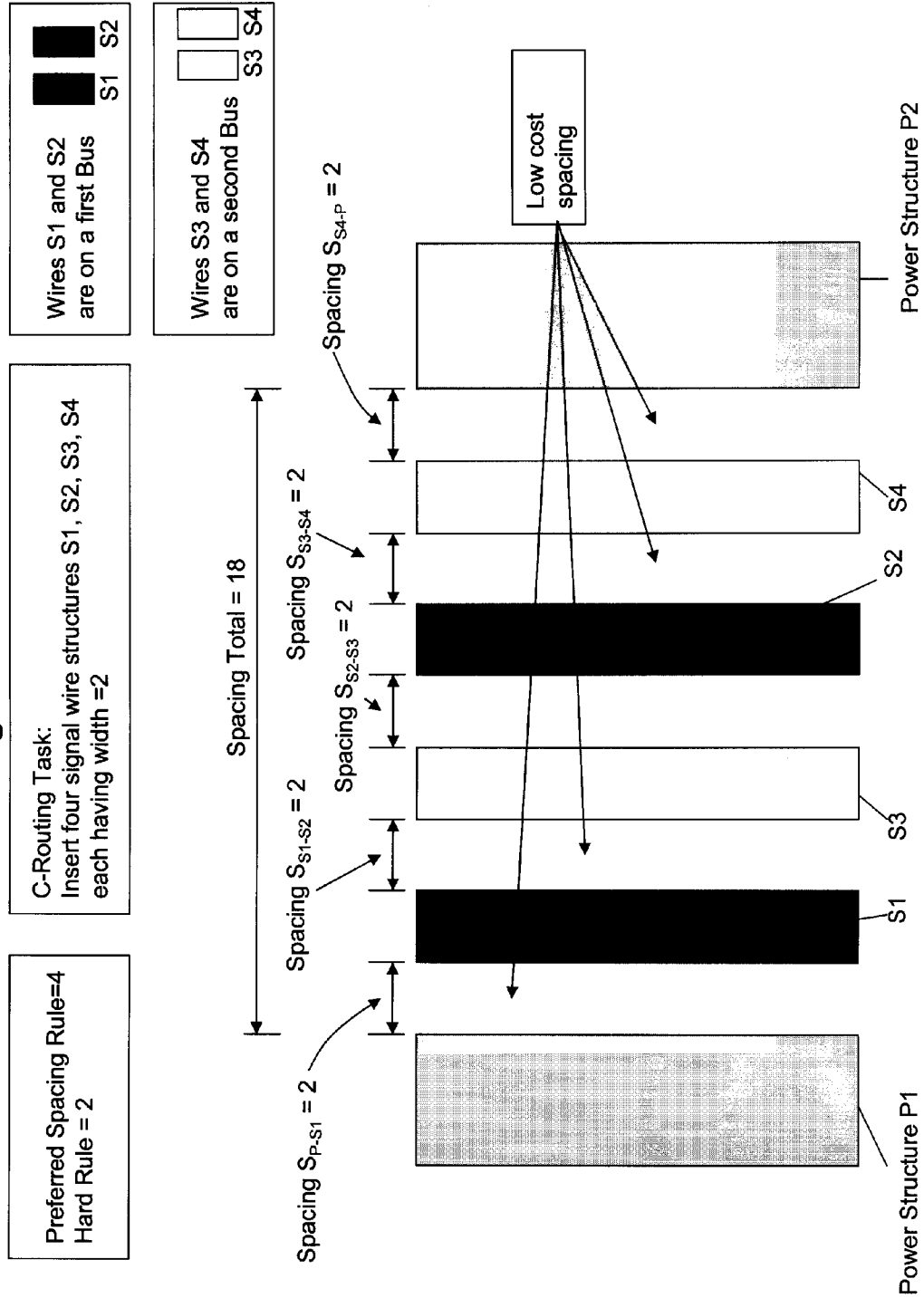

FIGS. 8A-C provide an illustrative example for C-routing where net re-ordering is employed to perform track assignments to reduce costs. FIG. 8A shows a layout portion that includes two power structures P1 and P2, and in which a total spacing distance of 18 exists between the edges of P1 and P2. The C-routing task is to configure the track assignments for four signal wires S1, S2, S3, and S4 between P1 and P2, all of the signal wires S1-S4 have widths of 4.

As before, assume that the preferred soft spacing rule is a distance of 4 and minimum hard spacing rule is a spacing distance of 2. Also assume that the cost of a spacing distance of 4 is less than the cost of a spacing distance of 2. Further assume that the cost of a routing configuration in which a signal wire is adjacent to a power structure is less than the cost of a configuration in which two signal wires are adjacent.

In this example, wires S1 and S2 are on a first bus and wires S3 and S4 are on a second bus. Wires that are on the same bus and that are adjacent to each other will more likely interfere with each other more than wires from different busses that are adjacent to each other. One reason for this is because the wires on different busses are likely to be on different clocks and will therefore switch at different time domains. As a result, all else being equal, the cost of two adjacent wires from the same bus will have a higher cost than two adjacent wires from different busses.

Since there is only the available space of 18 between P1 and P2 to route wires S1-S4, there can only be the hard rule spacing distance of 2 for wires S1-S4 between each other and between the other objects P1 and P2.

Assume that the initial order of nets is S1-S2-S3-S4. Referring FIG. 8B, this figure shows each of the wires S1-S2-S3-S4 routed with a spacing distance of 2. The spacing distance $S_{P1-S1}$ between P1 and S1 is 2, the spacing distance $S_{S1-S2}$ between S1 and S2 is 2, the spacing distance $S_{S2-S3}$ between S2 and S3 is 2, the spacing distance $S_{S3-S4}$, between S3 and S4 is 2, and the spacing distance $S_{S4-P2}$ between S4 and P2 is also 2.

Even though the spacing distances $S_{P1-S1}$ between P1 and S1 and $S_{S4-P2}$ between S4 and P2 are at the hard rule spacing distance of 2, these are low cost spacing distances since the signal wires are adjacent to power structures. The spacing distance $S_{S2-S3}$ between S2 and S3 is also at a low cost, even though it is at the hard rule spacing distance of 2, since the two signal wires S2 and S3 are on different busses.

However, the spacing distances $S_{S1-S2}$ between S1 and S2 and $S_{S3-S4}$ between S3 and S4 are at a high cost since they are between signal wires on the same busses and at the hard spacing rule of 2. It would be desirable to avoid having to incur this cost.

According to some embodiments of the invention, re-ordering can be performed to reduce the cost of the possible routing options. As shown in FIG. 8C, ordering is applied to perform bus interleaving to create the order for wires S1-S3-S2-S4, rather than the initial order of the wires S1-S2-S3-S4.

By performing bus interleaving, each signal wire can be routed without having another signal wire adjacent that is from the same bus. With this re-ordered configuration, the spacing distance $S_{P1-S1}$ between P1 and S1 remains at 2, the new spacing distance $S_{S1-S3}$ between S1 and S3 is set at 2, the spacing distance $S_{S3-S2}$ between S3 and S2 remains at 2, the new spacing distance $S_{S2-S4}$ between S2 and S4 is at 2, and the spacing distance $S_{S4-P2}$ between S4 and P2 remains at 2.

Even though the spacing distances $S_{S1-S3}$, $S_{S3-S2}$, and $S_{S2-S4}$ between the signal wires are all at the hard rule spacing distance of 2, these are low cost spacing distances since the adjacent signal wires are on different busses. The spacing distances $S_{P1-S1}$ between P1 and S1 and $S_{S4-P2}$ between S4 and P2 are also at the hard rule spacing distance of 2, but these are also low cost spacing distances since the signal wires are adjacent to power structures.

Therefore, what has been described is an improved approach for implementing C-routing. According to the disclosed embodiments, cost-based analysis is performed to balance the different rule requirements, to optimize the assignment of objects and nets during C-routing.

System Architecture Overview

Figure 9:
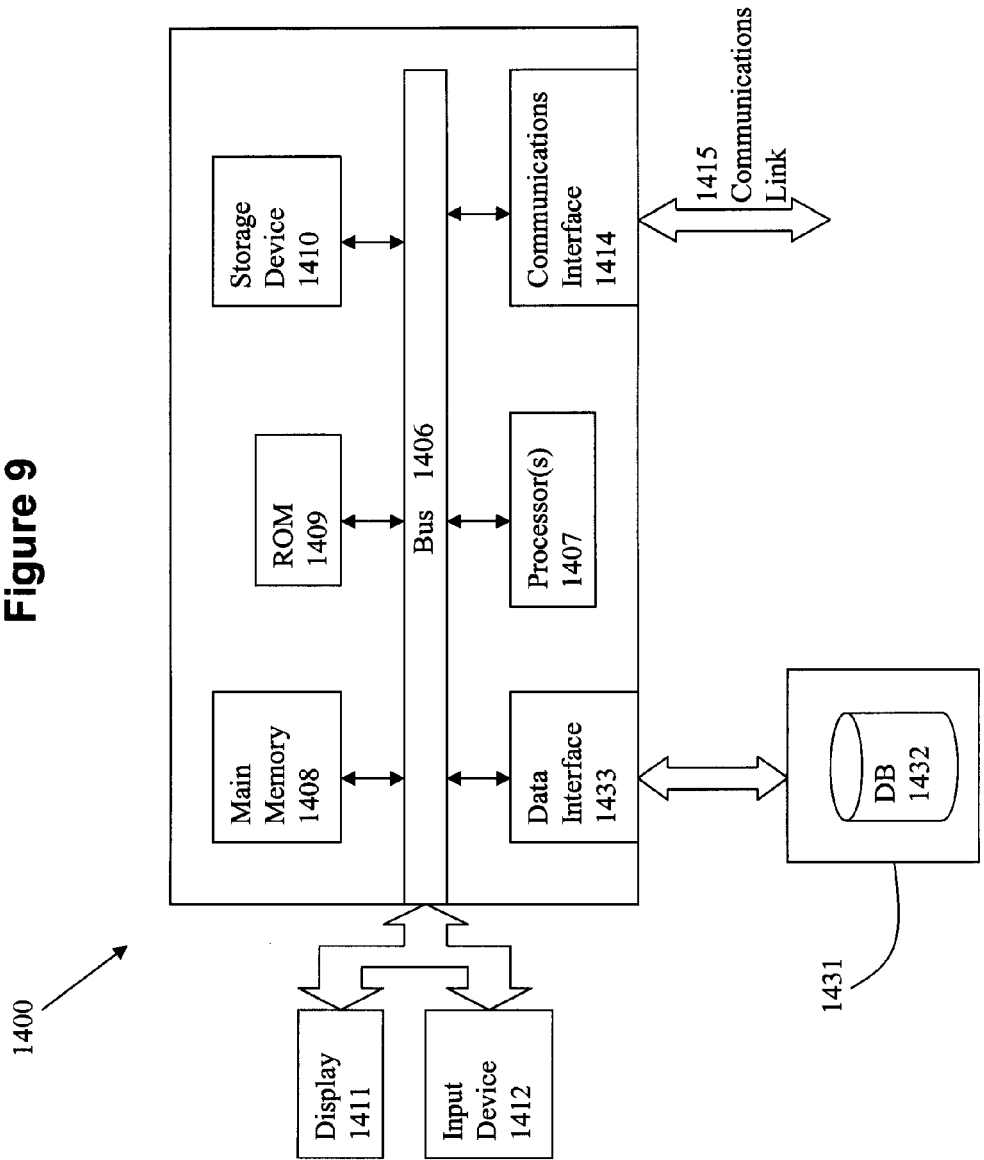
FIG. 9 depicts a computerized system on which a method for timing closure with concurrent process models can be implemented.

FIG. 9 is a block diagram of an illustrative computing system 1400 suitable for implementing an embodiment of the present invention. Computer system 1400 includes a bus 1406 or other communication mechanism for communicating information, which interconnects subsystems and devices, such as processor 1407, system memory 1408 (e.g., RAM), static storage device 1409 (e.g., ROM), disk drive 1410 (e.g., magnetic or optical), communication interface 1414 (e.g., modem or Ethernet card), display 1411 (e.g., CRT or LCD), input device 1412 (e.g., keyboard), and cursor control.

According to one embodiment of the invention, computer system 1400 performs specific operations by processor 1407 executing one or more sequences of one or more instructions contained in system memory 1408. Such instructions may be read into system memory 1408 from another computer readable/usable medium, such as static storage device 1409 or disk drive 1410. In alternative embodiments, hard-wired circuitry may be used in place of or in combination with software instructions to implement the invention. Thus, embodiments of the invention are not limited to any specific combination of hardware circuitry and/or software. In one embodiment, the term "logic" shall mean any combination of software or hardware that is used to implement all or part of the invention.

The term "computer readable medium" or "computer usable medium" as used herein refers to any medium that participates in providing instructions to processor 1407 for execution. Such a medium may take many forms, including but not limited to, non-volatile media and volatile media. Non-volatile media includes, for example, optical or magnetic disks, such as disk drive 1410. Volatile media includes dynamic memory, such as system memory 1408.

Common forms of computer readable media includes, for example, floppy disk, flexible disk, hard disk, magnetic tape, any other magnetic medium, CD-ROM, any other optical medium, punch cards, paper tape, any other physical medium with patterns of holes, RAM, PROM, EPROM, FLASH-EPROM, any other memory chip or cartridge, or any other medium from which a computer can read.

In an embodiment of the invention, execution of the sequences of instructions to practice the invention is performed by a single computer system 1400. According to other embodiments of the invention, two or more computer systems 1400 coupled by communication link 1415 (e.g., LAN, PTSN, or wireless network) may perform the sequence of instructions required to practice the invention in coordination with one another.

Computer system 1400 may transmit and receive messages, data, and instructions, including program, i.e., application code, through communication link 1415 and communication interface 1414. Received program code may be executed by processor 1407 as it is received, and/or stored in disk drive 1410, or other non-volatile storage for later execution.

In the foregoing specification, the invention has been described with reference to specific embodiments thereof. It will, however, be evident that various modifications and changes may be made thereto without departing from the broader spirit and scope of the invention. For example, the above-described process flows are described with reference to a particular ordering of process actions. However, the ordering of many of the described process actions may be changed without affecting the scope or operation of the invention. The specification and drawings are, accordingly, to be regarded in an illustrative rather than restrictive sense.

What is claimed is:

1. A computer implemented method for considering both hard design rule and soft design rules during C-routing, comprising:
using at least one processor for performing a process, the process comprising:
concurrently considering a hard design rule in a rule deck for the electronic design and a soft design rule in the rule deck for physically implementing an electronic design, wherein the soft design rule specifies a different threshold for a feature in the electronic design than the hard design rule but does not need to be satisfied;
determining multiple design configurations for performing C-routing for a net to be physically implemented in the electronic design, wherein the multiple design configurations comprises at least a first configuration generated for the net in the electronic design by complying with the hard design rule and a second configuration generated for the net in the electronic design by complying with the soft design rule; and
performing the C-routing that physically routes at least a part of the net by determining a physical location of the at least a part of the net that interconnects two blocks prior to performing detail routing for a remaining portion of the net within the two blocks by concurrently considering both the hard rule and the soft rule for the C-routing based at least in part upon a lower cost among costs of the multiple design configurations to generate a C-route, wherein the C-route comprises an interconnect segment generated to cross at least boundaries of the two blocks in a physical design of the electronic circuit design with the soft design rule but without regard to the hard design rule; and
performing the detail routing to complete the remaining portion of the net after performing the C-routing to generate one or more C-routes that include the C-route.

2. The computer implemented method of claim 1 in which the first configuration using the hard design rule is considered to have a higher cost than the second configuration using the soft design rule.

3. The computer implemented method of claim 1 in which an existing circuit design object is moved to create a lower cost configuration.

4. The computer implemented method of claim 1 in which circuit design objects are ordered to create a lower cost configuration.

5. The computer implemented method of claim 4 in which ordering is performed to create bus interleaving.

6. The computer implemented method of claim 4 in which ordering is performed to position a signal wire object adjacent to a power structure object.

7. The computer implemented method of claim 1 in which a neighbor index is employed to determine the costs, the neighbor index used to weight the positioning of one design object relative to another design object.

8. The computer implemented method of claim 1 in which track assignments are generated for the net that is C-routed.

9. A system for implementing C-routing of an electronic design, comprising:
   a non-transitory computer readable storage medium to store some or all of an electronic design,
      the electronic design corresponding to a net to be C-routed within the electronic design,
      the electronic design corresponding to a hard design rule in a rule deck for the electronic design for physically implementing the electronic design, and
      the electronic design corresponding to a soft design rule in the rule deck for physically implementing the electronic design, wherein the soft design rule specifies a different threshold for a feature in the electronic design that the hard design rule but does not need to be satisfied; and
   a processor that is to execute computer program code to:
      concurrently consider the hard design rule and the soft design rule in implementing the electronic design;
      determine multiple design configurations for performing C-routing for a net to be physically implemented in the electronic design, wherein the multiple design configurations comprises at least a first configuration generated for the net in the electronic design by complying with the hard design rule and at least a second configuration generated for the net in the electronic design by complying with the soft design rule; and
      perform C-routing that physically routes at least a part of the net by determining a physical location of the at least a part of the net that interconnects two blocks prior to performing detail routing for a remaining portion of the net within the two blocks by concurrently considering both the hard rule and the soft rule for the C-routing based at least in part upon a lower cost among costs of the multiple design configurations to generate a C-route, wherein the C-route comprises an interconnect segment generated to cross at least boundaries of the two blocks in a physical design of the electronic circuit design with the soft design rule but without regard to the hard design rule; and
      perform the detail routing to complete the remaining portion of the net after performing the C-routing to generate one or more C-routes that include the C-route.

10. The system of claim 9, in which the first configuration using the hard design rule is considered to have a higher cost than the second configuration using the soft design rule.

11. The system of claim 9, in which an existing circuit design object is moved to create a lower cost configuration.

12. The system of claim 9, in which circuit design objects are ordered to create a lower cost configuration.

13. The system of claim 12, in which ordering is performed to create bus interleaving.

14. The system of claim 12, in which ordering is performed to position a signal wire object adjacent to a power structure object.

15. The system of claim 9, in which a neighbor index is employed to determine the costs, the neighbor index used to weight the positioning of one design object relative to another design object.

16. The system of claim 9, in which track assignments are generated for the net that is C-routed.

17. A computer program product that includes a non-transitory computer readable storage medium, the non-transitory computer readable medium comprising a plurality of computer instructions which, when executed by a processor, cause the processor to execute performing a method for considering both hard design rule and soft design rules during C-routing, the method comprising:
   using at least one processor for performing a process, the process comprising:
   concurrently considering a hard design rule in a rule deck for the electronic design and a soft design rule in the rule deck for physically implementing an electronic design, wherein the soft design rule specifies a different threshold for a feature in the electronic design that the hard design rule but does not need to be satisfied;
   determining multiple design configurations for performing C-routing for a net to be physically implemented in the electronic design, wherein the multiple design configurations comprises at least a first configuration generated for the net in the electronic design by complying with the hard design rule and a second configuration generated for the net in the electronic design by complying with the soft design rule; and
   performing C-routing that physically routes at least a part of the net by determining a physical location of the at least a part of the net that interconnects two blocks prior to performing detail routing for a remaining portion of the net within the two blocks by concurrently considering both the hard rule and the soft rule for the C-routing based upon cost analysis based at least in part upon a lower cost among costs of the multiple design configurations, to generate a C-route, wherein the C-route comprises an interconnect segment generated to cross at least boundaries of the two blocks in a physical design of the electronic circuit design with the soft design rule but without regard to the hard design rule; and
   performing the detail routing to complete the remaining portion of the net after performing the C-routing to generate one or more C-routes that include the C-route.

18. The computer program product of claim 17, in which the first configuration using the hard design rule is considered to have a higher cost than the second configuration using the soft design rule.

19. The computer program product of claim 17, in which an existing circuit design object is moved to create a lower cost configuration.

20. The computer program product of claim 17, in which circuit design objects are ordered to create a lower cost configuration.

21. The computer program product of claim 20, in which ordering is performed to create bus interleaving.

22. The computer program product of claim 20, in which ordering is performed to position a signal wire object adjacent to a power structure object.

23. The computer program product of claim 17, in which a neighbor index is employed to determine the costs, the neighbor index used to weight the positioning of one design object relative to another design object.

* * * * *